United States Patent
Ikushima

(10) Patent No.: US 6,715,506 B1
(45) Date of Patent: Apr. 6, 2004

(54) METHOD AND DEVICE FOR INJECTING A FIXED QUANTITY OF LIQUID

(75) Inventor: Kazumasa Ikushima, Mitaka (JP)

(73) Assignee: Musashi Engineering, Inc., Mitaka (JP)

( * ) Notice: Subject to any disclaimer, the term of this patent is extended or adjusted under 35 U.S.C. 154(b) by 0 days.

(21) Appl. No.: 09/868,630

(22) PCT Filed: Dec. 17, 1999

(86) PCT No.: PCT/JP99/07099

§ 371 (c)(1),
(2), (4) Date: Oct. 9, 2001

(87) PCT Pub. No.: WO00/40346

PCT Pub. Date: Jul. 13, 2000

(30) Foreign Application Priority Data

| Dec. 28, 1998 | (JP) | 10-373641 |
| May 7, 1999 | (JP) | 11-127095 |
| May 10, 1999 | (JP) | 11-128916 |
| May 28, 1999 | (JP) | 11-149647 |
| May 28, 1999 | (JP) | 11-149681 |
| Jun. 1, 1999 | (JP) | 11-154000 |

(51) Int. Cl.[7] .............................. B05D 1/26; B05C 5/02; G01F 17/00; H01L 21/027
(52) U.S. Cl. .................... 137/14; 137/487.5; 222/1; 222/63; 222/387; 222/390; 141/26; 141/95; 118/684; 118/692
(58) Field of Search .................. 137/14, 334, 487.5; 118/667, 679, 683, 684, 692; 141/18, 20.5, 21, 25, 26, 27, 95; 222/1, 55, 63, 71, 387, 390, 504, 518

(56) References Cited

U.S. PATENT DOCUMENTS

| 4,066,188 A | * | 1/1978 | Scholl et al. ............. 222/146.5 |
| 4,465,212 A | * | 8/1984 | Boone .......................... 222/504 |
| 4,922,852 A | | 5/1990 | Price ............................ 118/683 |
| 5,148,946 A | * | 9/1992 | Mizuta et al. .................. 222/1 |
| 5,277,333 A | * | 1/1994 | Shimano ....................... 222/14 |

FOREIGN PATENT DOCUMENTS

| JP | 62-186965 | 8/1987 |
| JP | 63-299191 | 12/1988 |
| JP | 05-168996 | 7/1993 |
| JP | 08-039763 | 2/1996 |
| JP | 10-277457 | 10/1998 |

OTHER PUBLICATIONS

International Preliminary Examination Report on the corresponding application PCT/JP99/07099; Mar. 2001.*

* cited by examiner

Primary Examiner—Ramesh Krishnamurthy
(74) Attorney, Agent, or Firm—Westerman, Hattori, Daniels & Adrian, LLP

(57) ABSTRACT

The present invention is a method and apparatus for ejecting a very small amount of liquid at high speed and precisely independent of the viscosity of the liquid. This apparatus and method begins by applying pressure to the liquid prior to starting ejection of the liquid and/or holding a pressure near an ejection orifice after the end of liquid ejection at a predetermined specific value so that an ejection rate of the liquid through the ejection orifice is kept constant. This apparatus and method is able to control the liquid temperature and able to refill the liquid without entrapment of bubbles occurring.

23 Claims, 18 Drawing Sheets

METHOD AND DEVICE FOR INJECTING A FIXED QUANTITY OF LIQUID

TECHNICAL FIELD

The present invention relates to a fixed-amount-of-liquid ejecting method and apparatus which are suitably used for ejecting a liquid in fixed amount, the liquid including a viscous fluid, a material having consistency, etc. More particularly, in the field of ejecting or applying a very small amount of liquid, the present invention relates to a technique for controlling the operation of ejecting or applying a very small amount of liquid in a high-speed and precise manner. Further, the present invention relates to a technique for filling a liquid in a liquid reservoir for use in all kinds of processes, e.g., an electronic parts manufacturing process and an electronic parts assembling process, which require a step of ejecting or applying a liquid that includes a viscous fluid and a material having consistency.

BACKGROUND ART

Generally, a fixed-amount-of-liquid ejecting apparatus is employed for the purpose of ejecting a desired amount of liquid, and a method of utilizing both the fixed-amount-of-liquid ejecting apparatus and a robot capable of moving a member to which a liquid is to be applied (referred to also as an applied member hereinafter) or a nozzle is employed for the purpose of applying the liquid in a desired pattern.

As techniques for ejecting a liquid, there are known a pneumatic type method and a plunger type method. In the pneumatic type method, compressed air regulated in pressure is imparted to a liquid for a desired period of time. In the plunger type method, a push member operatively connected to a driving source is disposed in a liquid-tight condition, and it is moved through a desired distance.

The pneumatic type method is a quite simple method utilizing compressed air. Since only compressed air contacts a liquid except for a reservoir, this provides such an advantage that the liquid can be employed while it is kept clean. For this reason, the pneumatic type method is very popularly practiced.

On the other hand, the plunger type method is advantageous in that the volume of liquid ejected can be determined based on a cross-sectional area of the push member contacting the liquid and a distance through which the push member is moved. For this reason, the plunger type method is a method utilized when applying a very small amount of liquid as required in operation of filling or pipetting the liquid.

Conventionally, a liquid has been applied in a desired pattern as follows. A liquid in a reservoir is forced to move using one of the above-described methods, causing the liquid to be ejected through a nozzle end serving as an apparatus ejection orifice. Simultaneously, one or both of the apparatus ejection orifice and a member to which a liquid is to be applied are moved relatively to each other so that the liquid draws the desired pattern. However, because the above-described methods require a time until a flow speed of the liquid reaches a certain constant value, it has been very difficult to draw a uniform line of the applied liquid for a time until the constant flow speed is obtained. Such an adverse effect is significant particularly in the case of employing a highly viscous liquid or applying a liquid at a high speed. Concretely, the adverse effect appears in the form of narrowing or discontinuity in a starting portion of the applied liquid line, and in the form of fatting or pooling in an ending portion of the applied liquid line.

Japanese Unexamined Patent Publication No. 4-49108, for example, discloses one example of a conventional fixed-amount-of-liquid ejecting apparatus for use in regularly or irregularly coating an electronic material on a board in the form of points and lines in semiconductor manufacturing processes. In the disclosed ejecting apparatus, the amount of liquid ejected through an ejection orifice is controlled in accordance with such a parameter as the speed and cycle time of rotation of a screw, etc. With the disclosed apparatus, the rotational speed and the stop timing of the screw are controlled with high accuracy. Therefore, the amount of the ejected liquid is stabilized and the liquid ejection in fixed amount can be achieved even in a continuous ejection mode without being affected by the viscosity and fluidity of the liquid and the amount of liquid present in a reservoir. In the above prior art apparatus, however, the liquid is ejected and stopped respectively upon rotation and stoppage of the screw, and the ejection orifice is left in a physically open state during the time in which the ejection is stopped. This has raised the following problem, particularly in the case of the liquid having a low viscosity or the case of pressurizing the liquid in the reservoir. If there is a relatively large clearance between an outer peripheral surface of the screw and an inner peripheral surface of a screw housing, the liquid is not positively shut off at the time of stopping the liquid ejection, and the liquid tends to leak due to the own weight and a force applied to pressurize the liquid. On the other hand, if the clearance between the outer peripheral surface of the screw and the inner peripheral surface of the screw housing is set to such a small value as able to overcome the above problem, another problem has arisen in that fillers, for example, mixed in the electronic material are broken.

Further, the pneumatic type method employed a highly compressible air, and therefore has a big difficulty in achieving a desired pressure in a short time. Stated otherwise, it has been more difficult to form the applied liquid line having the same shape between start and end points and an intermediate area with the pneumatic type method. Another problem has been encountered in that because the liquid viscosity changes depending on, e.g., variations in an ambient atmosphere and a chemical reaction of the liquid itself, the amount of the ejected liquid is also changed depending on a change of the liquid viscosity when the pneumatic type method is employed in which a regulated constant pneumatic pressure acts upon the liquid. Thus, it has been impossible to apply a liquid tending to change its viscosity in the fine uniform form by using a pneumatic type ejecting apparatus.

The plunger type method has a basic function in ejecting a liquid in predetermined volume, and therefore it has been primarily used in applications for precisely pipetting or filling a desired amount of liquid. Also, the plunger type method has features superior in preciseness and constant amount because the amount of the ejected liquid is determined by a distance through which a piston moves. For that reason, the ejection operation is generally performed in a very cautious and slow manner. Thus, in the technique using the plunger type method, the essential purport resides in precisely ejecting and applying a fixed amount of liquid, and even if a change occurs in flow speed of the liquid during the ejection, there is no problem so long as the resulting amount of the applied liquid is uniform. Further, the plunger type method is avoided from being used for ejecting a highly viscous liquid. The reason is that a highly viscous liquid requires a very great force to be acted on the liquid for producing a flow of the same. Such a great force causes expansion and distortion of the reservoir and the piston, as well as compression of a liquid which hardly develops elastic deformation. These deformations impair the features of the plunger type method, i.e., preciseness and constant amount.

Particularly, when applying a highly viscous liquid at a high speed, or when using a narrow or long nozzle even in the case of applying a low viscous liquid, a very high pressure requires to be acted upon the liquid, and deformations such as expansion, distortion and compression become more remarkable. Further, because of such a specific feature of the plunger type method that only an ejection orifice is opened to the atmosphere, an adverse effect of those deformations is increased as a higher pressure is acted upon the liquid and as the ejection orifice has a smaller diameter. Concretely, the adverse effect has appeared in such phenomena as a delay and a liquid dripping in the ejection process, and discontinuity, pooling and distortion in the form of the applied liquid line. Although the above-mentioned deformations are very small, the adverse effect caused by those deformations brings about a fatal problem in the case of applying a liquid in the fine form, or the case of applying a liquid in very small amount, or the case of applying a liquid at a high speed. For that reason, the plunger type method is quite unsuitable for any of those cases requiring a high pressure.

Further, it is generally known that for the purpose of ejecting a desired amount of liquid, a fixed-amount-of-liquid ejecting apparatus is employed which ejects a fixed amount of liquid supplied from a liquid reservoir through an ejection valve, and that for the purpose of applying a liquid in a desired pattern, a method of utilizing both the fixed-amount-of-liquid ejecting apparatus and a robot capable of moving a member to which a liquid is to be applied or a nozzle is employed. Where a liquid having a medium or higher level of viscosity, for example, is filled in a liquid reservoir, particularly a syringe, it is often practiced to provide a liquid outlet on a pressure container in which the liquid is filled beforehand, to air-tightly connect the liquid reservoir, particularly the syringe, to the liquid outlet, and to introduce air to the pressure container for pressurization, thereby causing the liquid to be filled into the syringe through the liquid outlet.

The above prior art however has a serious problem as follows. When pressurized air is introduced to the pressure container for filling the liquid into the syringe through the liquid outlet and a syringe connecting portion, the liquid is released to the atmosphere in the syringe. For a liquid having higher viscosity, therefore, the liquid tends to be released more vigorously and to fill the syringe while entrapping a larger amount of bubbles corresponding to an inner diameter of the syringe connecting portion. The reason is that since the syringe into which the liquid is filled is under an atmospheric condition, the filled liquid is brought into a free state in the syringe connecting portion.

DISCLOSURE OF THE INVENTION

An object of the present invention is to provide a fixed-amount-of-liquid ejecting method and apparatus which are suitably used for ejecting a liquid in fixed amount, the liquid including a viscous fluid, a material having consistency, etc.

Another object of the present invention is to provide a method and apparatus with which, when ejecting or applying a very small amount of liquid, the liquid can be applied in a desired form at a high speed and precisely without depending on viscosity of the liquid. Still another object of the present invention is to provide a method and apparatus with which, particularly even when employing a highly viscous liquid or applying a liquid at a high speed, a shape of the applied liquid line can be very easily controlled in starting and ending portions of the applied liquid line. For example, when the liquid should be applied in a linear uniform shape, the applied liquid line can be formed with a uniform width from the start point to the end point of the line without narrowing and fatting.

Still another object of the present invention is to provide a liquid ejecting method and apparatus which can more positively shut off a liquid at the time of stopping the liquid ejection without a risk of breaking fillers, and can securely avoid a leakage of the liquid.

Still another object of the present invention is to provide a liquid ejecting or applying method and apparatus which enables an applied liquid to be drawn in a uniform line without taking a time until a flow speed of the liquid reaches a certain value.

Still another object of the present invention is to provide a fixed-amount-of-liquid ejecting method and apparatus with which, when filling a liquid in a liquid reservoir, particularly in a syringe, the liquid can be filled without entrapping bubbles, preferably, in a fully automated manner.

The present invention provides a fixed-amount-of-liquid ejecting method for ejecting a liquid in fixed amount from a liquid reservoir through an ejection valve, the method being featured by comprising a step of applying a pressure to the liquid beforehand prior to starting ejection of the liquid and/or holding a pressure near an ejection orifice after the end of the liquid ejection at a predetermined specific value using a push member disposed to push a liquid stored in the liquid reservoir so that an ejection rate of the liquid through the ejection orifice is kept constant.

The predetermined specific value is preferably maintained by detecting a liquid pressure near the ejection orifice and automatically regulating an ejection pressure of the liquid in accordance with a detected result.

The above fixed-amount-of liquid ejecting method according to the present invention is further featured by a step of controlling a pressure of the liquid supplied from the liquid reservoir to the ejection valve. The control of the liquid pressure is preferably performed by controlling a pressure of the liquid stored in the liquid reservoir, preferably by controlling, preferably constant or variable, a rate at which the liquid stored in the liquid reservoir reduces.

The above fixed-amount-of-liquid ejecting method according to the present invention is further featured by that a temperature of the liquid in the liquid reservoir and the ejection valve is controlled to be held at a desired temperature.

The above fixed-amount-of-liquid ejecting method according to the present invention is further featured by that the ejection valve includes a nozzle having in itself a function of a needle valve.

Stated otherwise, in the concrete form of the fixed-amount-of-liquid ejecting method according to the present invention, the step of applying a pressure to the liquid beforehand prior to starting ejection of the liquid and/or holding a pressure near an ejection orifice after the end of liquid ejection at a predetermined specific value, so that an ejection rate of the liquid through the ejection orifice is kept constant, is preferably realized as follows. For ejecting the liquid in fixed amount from the liquid reservoir through the ejection valve, the above step comprises a step of detecting a liquid pressure near the ejection orifice and automatically regulating an ejection pressure of the liquid in accordance with a detected result; and/or a step of controlling a pressure of the liquid stored in the liquid reservoir by, preferably, controlling, preferably constant or variable, a rate at which the liquid stored in the liquid reservoir reduces; and/or a step of controlling a pressure of the liquid supplied from the liquid reservoir to the ejection valve. Further, a temperature of the liquid in the liquid reservoir and the ejection valve is controlled to be held at a desired temperature. Still further, the ejection valve includes a nozzle having in itself a function of a needle valve.

The present invention also provides a fixed-amount-of-liquid ejecting method which is featured by further including a liquid filling process wherein, when filling a liquid in the liquid reservoir from a pressure container in which the liquid is stored beforehand, a liquid pressure in the liquid reservoir is controlled to a constant pressure lower than the pressure of air introduced to the pressure container for pressurization, thereby automatically filling the liquid without entrapment of bubbles.

The above liquid filling process is further featured by automatically stopping filling of the liquid is upon sensing of a full-amount state of the liquid in the liquid reservoir. Also, the above liquid filling process is further featured by automatically stopping filling of the liquid upon sensing of a small remaining-amount state of the liquid in the pressure container. Moreover, the above liquid filling process is further featured by removing bubbles accidentally generated in the liquid reservoir.

Stated otherwise, in the concrete form of the liquid filling process, when filling a liquid in the liquid reservoir from a pressure container in which the liquid is stored beforehand, a liquid pressure in the liquid reservoir is controlled to a constant pressure lower than the pressure of air introduced to the pressure container for pressurization; and/or bubbles accidentally generated in the liquid reservoir are removed; and/or filling of the liquid is automatically stopped upon sensing of a full-amount state of the liquid in the liquid reservoir or of a small remaining-amount state of the liquid in the pressure container, as necessary, thereby automatically filling the liquid without entrapment of bubbles.

Furthermore, the present invention provides a fixed-amount-of-liquid ejecting apparatus comprising a liquid reservoir, means for pressurizing a liquid comprising a push member disposed to push a liquid in the liquid reservoir, and an ejection valve communicating with the liquid reservoir, thereby ejecting the liquid in fixed amount from the liquid reservoir through the ejection valve, wherein the apparatus further comprises operation control means for controlling operations of the pressurizing means and the ejection valve, and ejection pressure control means for automatically regulating an ejection pressure of the liquid.

Preferably, the ejection pressure control means comprises an input/output unit, a processing unit and a storage unit, and functions to automatically regulate an ejection pressure of the liquid in accordance with a detected result of a pressure sensor for detecting a liquid pressure near an ejection orifice. The ejection valve preferably includes means for mechanically opening and closing an ejection orifice of the ejection valve. Preferably, the pressurizing means comprises means for pressurizing the liquid stored in the liquid reservoir under a pressure depending on viscosity of the liquid. Also, the pressurizing means preferably comprises a push member disposed to push the liquid stored in the liquid reservoir in a precise and fluid-tight manner, more preferably comprises a push member which is associated with an air cylinder for pressing the push member and having a bore diameter sufficiently greater than the inner diameter of the liquid reservoir, and which is disposed to push the liquid stored in the liquid reservoir in a precise and fluid-tight manner. Preferably, the operation control means comprises a pressure sensor for detecting a liquid pressure near an ejection orifice, and means for operating the pressurizing means in accordance with a signal from the pressure sensor.

As another feature, the fixed-amount-of-liquid ejecting apparatus according to the present invention further comprises liquid temperature control means for controlling a liquid temperature.

Stated otherwise, in the concrete form of the fixed-amount-of-liquid ejecting apparatus according to the present invention, the apparatus comprises a liquid reservoir; means for pressurizing a liquid in the liquid reservoir, preferably means for pressurizing the liquid stored in the liquid reservoir under a pressure depending on viscosity of the liquid, more preferably a push member disposed to push the liquid stored in the liquid reservoir in a precise and fluid-tight manner, most preferably a push member which is associated with an air cylinder for pressing the push member and having a bore diameter sufficiently greater than the inner diameter of the liquid reservoir; and an ejection valve communicating with the liquid reservoir and mechanically opening and closing the ejection orifice of the ejection valve. The apparatus further comprises operation control means for controlling operations of the pressurizing means and the ejection valve, the operation control means preferably comprising a pressure sensor for detecting a liquid pressure near an ejection orifice and means for operating the pressurizing means in accordance with a signal from the pressure sensor; and ejection pressure control means for automatically regulating an ejection pressure of the liquid, the ejection pressure control means preferably comprising an input/output unit, a processing unit and a storage unit, and functioning to automatically regulate an ejection pressure of the liquid in accordance with a detected result of a pressure sensor for detecting a liquid pressure near an ejection orifice; and/or liquid temperature control means for controlling a liquid temperature.

As still another feature, in above the fixed-amount-of-liquid ejecting apparatus according the present invention, the ejection valve includes a nozzle provided with a valve mechanism in a nozzle body.

As still another feature, in the above fixed-amount-of-liquid ejecting apparatus according to the present invention, the ejection valve comprises a valve body having an inlet port in communication with the liquid reservoir, a liquid chamber formed therein to contain the liquid introduced through the inlet port, and an outlet port through which the liquid in the liquid chamber is ejected; a needle-like valve stem disposed in the liquid chamber movably between a first position and a second position; a valve seat formed to receive a tip of the valve stem to thereby close the outlet port when the valve stem is in the first position; and pressure compensating means for changing the volume of the liquid chamber in synch with movement of the valve stem so that variations of liquid pressure in the liquid chamber caused by movement of the valve stem is canceled.

As still another feature, the fixed-amount-of-liquid ejecting apparatus according the present invention further includes a filling apparatus which comprises a liquid reservoir including a plunger inserted therein in an airtight manner, a pressure container in which the liquid is stored beforehand, and a plunger direct-actuating control mechanism for maintaining a liquid pressure in the liquid reservoir at a constant pressure lower than the pressure of air introduced to the pressure container for pressurization, thereby automatically filling the liquid in the liquid reservoir without entrapment of bubbles.

The above filling apparatus is further featured by comprising means for sensing a full-amount state of the liquid in the liquid reservoir and/or means for sensing a small remaining-amount state of the liquid in the pressure container, and for automatically stopping filling of the liquid in accordance with a sensed signal. The above filling apparatus is further featured by including a valve structure which has an air release hole for communicating the plunger inserted in the liquid reservoir with the outside and is able to close the air release hole at any time, so that bubbles accidentally generated in the liquid reservoir may be removed.

Stated otherwise, in the concrete form of the liquid filling apparatus, the apparatus comprises a liquid reservoir including a plunger inserted therein in an airtight manner; a pressure container in which the liquid is stored beforehand; and a plunger direct-actuating control mechanism for maintaining a liquid pressure in the liquid reservoir at a constant pressure lower than the pressure of air introduced to the pressure container for pressurization; and/or means for sensing a full-amount state of the liquid in the liquid reservoir and/or means for sensing a small remaining-amount state of the liquid in the pressure container, and for automatically stopping filling of the liquid in accordance with a sensed signal as necessary; and/or a valve structure which has an air release hole for communicating the plunger inserted in the liquid reservoir with the outside and is able to close the air release hole at any time, so that bubbles accidentally generated in the liquid reservoir may be removed, thereby automatically filling the liquid in the liquid reservoir without entrapment of bubbles.

The mode for carrying out the present invention will be described below in connection with the form including liquid temperature control means. As described above, the present invention resides in a fixed-amount-of-liquid ejecting method wherein, for ejecting a liquid in fixed amount from a liquid reservoir through an ejection valve, the method comprises a step of applying a pressure to the liquid beforehand prior to starting ejection of the liquid and/or holding a pressure near an ejection orifice after the end of liquid ejection at a predetermined specific value so that an ejection rate of the liquid through the ejection orifice is kept constant. The control of the liquid pressure in the above method is performed by controlling a pressure of the liquid stored in the liquid reservoir, preferably by controlling constant or variable a rate at which the liquid stored in the liquid reservoir reduces. Also, temperatures of the liquid in the liquid reservoir and the ejection valve are controlled to be held at desired temperatures.

Further, the apparatus of the present invention includes operation control means for controlling operations of the pressurizing means and the ejection valve, and liquid temperature control means for controlling a liquid temperature. The apparatus of the present invention may be of the pneumatic type or the plunger type. The following description will be made of features of the pneumatic type apparatus or features common to both the types of apparatus unless otherwise specified.

The ejection valve includes means for mechanically opening and closing the ejection orifice of the ejection valve. The pressurizing means is means for pressurizing the liquid stored in the liquid reservoir under a pressure depending on viscosity of the liquid. Preferably, the pressurizing means is a push member disposed to push the liquid stored in the liquid reservoir in a precise and fluid-tight manner. The push member is associated with an air cylinder for pressing the push member and having a bore diameter sufficiently greater than the inner diameter of the liquid reservoir. The operation control means comprises a pressure sensor for detecting a liquid pressure near the ejection orifice, and means for operating the pressurizing means in accordance with a signal from the pressure sensor. The liquid temperature control means comprises temperature sensors for detecting respective liquid temperatures in the liquid reservoir and the pressure container, and heating/cooling units maintained at desired temperatures in accordance with signals from the temperature sensors.

The liquid temperature control means will now be described.

Viscosity of a liquid changes depending on not only variations in temperature but also a chemical reaction of the liquid itself, for example. The amount of ejected liquid is also slightly changed depending on such a change of the liquid viscosity. In the prior art, however, an attention has been focused on precise control of the rotational speed of a screw and the timing of stopping the screw, and no considerations have been paid to viscosity and fluidity of a liquid as well as the amount of liquid in a liquid reservoir. The inventors have conducted a number of experiments based on such a hypothesis that controlling a liquid temperature so as to inhibit its change is effective in suppressing one, more exactly, primary one of factors which cause a viscosity change. As a result, it has been proved that controlling a liquid temperature to be held constant is effective in ejecting a liquid in fixed amount.

From an aspect of method, control of a liquid temperature is carried out by controlling temperatures of the liquid in the liquid reservoir and the ejection valve to be held at desired temperatures. From an aspect of apparatus, the liquid temperature control means is provided which comprises temperature sensors for detecting respective liquid temperatures in the liquid reservoir and the pressure container, and heating/cooling units maintained at desired temperatures in accordance with signals from the temperature sensors.

A description will now be made of other features of the present invention, i.e., the step of applying a pressure to the liquid beforehand prior to starting ejection of the liquid and/or holding a pressure near an ejection orifice after the end of liquid ejection at a predetermined specific value, and means for mechanically opening and closing the ejection orifice in an aspect of apparatus.

For example, when ejecting the liquid in relatively small fixed amount, the pressure in a flow passage after the end of the ejection, particularly the pressure near the ejection orifice, is controlled to be kept at the predetermined specific value, whereby the subsequent ejection of the liquid can be always performed under the constant flow passage condition. Accordingly, by properly setting the force, time, etc. for pressurizing the liquid in the liquid reservoir, the ejection of the liquid in an amount corresponding to the set values can be repeatedly reproduced with high reliability. On the other hand, when ejecting the liquid in relatively large fixed amount, in addition to the above control, the pressure of the supplied liquid is controlled also during the liquid ejection based on the detected result of the liquid pressure in such a manner, for example, that variations of the detected pressure is kept as small as possible. Consequently, the liquid can be ejected in fixed amount as intended.

Further, by mechanically opening the ejection orifice of the ejection valve in timed relationship with an increase of the force pressurizing the liquid in the liquid reservoir, the liquid ejection can be started without a time lag. At the end of the ejection, by removing the added increase of the pressurizing force and mechanically closing the ejection orifice of the ejection valve, one cycle of the liquid ejection in fixed amount can be ended with positive shutting-off of the liquid without a risk of liquid leakage.

After one cycle of the liquid ejection in fixed amount has been thus ended, the liquid pressure in the flow passage is controlled to be kept at the predetermined specific value depending on the detected liquid pressure in a similar way as described above.

With the apparatus of the present invention, in response to a pressure signal and a pressurizing time signal both supplied to the pressurizing means, the liquid in the liquid reservoir is pressurized for a time corresponding to the pressurizing time signal so that the liquid is held under a pressure corresponding to the pressure signal. Further, the ejection valve is opened in timed relationship with the operation of the pressurizing means, causing the liquid to be ejected through the ejection orifice. As a result, the ejection of the liquid can be started without a time lag. At the time when the time during which the liquid is pressurized by the pressurizing means reaches a predetermined time and the amount of the ejected liquid reaches a predetermined amount, the ejection valve is mechanically closed in timed relationship with the stop operation of the pressurizing means. The ejection orifice of the ejection valve is thereby physically closed. Therefore, the liquid is positively shut off and an accidental leakage of the liquid after the closing of the ejection orifice can be perfectly prevented. After one cycle of the liquid ejection in fixed amount has been ended, the liquid pressure near the ejection orifice is detected by the pressure sensor, and a detected pressure signal at that time is inputted to the control means. In accordance with the input signal, the control means controls the pressurizing means to raise or lower the liquid pressure so that the residual liquid pressure near the ejection orifice becomes the predetermined specific value. It is a matter of course that if the detected liquid pressure coincides with the predetermined specific value, the pressurizing means requires not to be operated again. By always keeping the liquid pressure near the ejection orifice and hence the pressure in the liquid flow passage at the constant values after the end of the ejection as described above, variations of the flow passage condition are eliminated. At the time of starting the next cycle of the liquid ejection in fixed amount, the force, time, etc. for pressurizing the liquid can be determined with no need of taking into account indefinite factors. In addition, the liquid can be ejected in fixed amount with high precision.

When one cycle of liquid ejection is continued for a relatively long time as experienced, for example, when the liquid is coated in the linear form, it is preferable that the pressure detection by the pressure sensor is also performed during the ejection and the liquid pressurizing force applied from the pressurizing means is controlled in accordance with the detected result.

In the apparatus of the present invention, preferably, the ejection valve comprises a needle valve. Since the size of a needle can be made in itself sufficiently small, the needle can be smoothly and quickly displaced to open and close by a relatively small driving force even under a high pressure on the order of, for example, 100 to 200 kgf/cm². It is therefore possible to shut off the liquid more positively at the end of the ejection, and to eliminate a time lag more effectively at the start of the ejection. In addition, since the required driving force is relatively small, the overall size of the ejection valve can be reduced.

More preferably, the needle valve is provided with a liquid pressure compensating piston. With this feature, the apparatus can operate so as to compensate pressure variations in the liquid passage, particularly at and near the ejection orifice, more easily, quickly and precisely in combination with back and forth movement of the liquid pressure compensating piston. One example of the combined operation is as follows. When the needle valve is opened, the volume occupied by the needle in an area near the ejection orifice is reduced. Conversely, when the needle valve is closed, the volume occupied by the needle in the area near the ejection orifice is increased. In the former case, a drop of the liquid pressure near the ejection orifice can be prevented by moving forth the liquid pressure compensating piston. In the latter case, a rise of the liquid pressure near the ejection orifice can be prevented by moving back the liquid pressure compensating piston. Accordingly, the liquid pressure compensating piston can be employed in addition to or in place of the pressurizing means for the purpose of controlling the residual liquid pressure after the end of the ejection to the predetermined specific value.

Further, when an ejection nozzle requires to be moved relative to a workpiece in the apparatus of the present invention, the ejection nozzle is preferably mounted to a manipulator which is based on the Cartesian coordinate system and enables the ejection nozzle to be displaced in three dimensional directions. More preferably, the manipulator is controlled in synchronous relation to control of the pressurizing means and control of the ejection valve.

As described above, the fixed-amount-of-liquid ejecting apparatus according to the present invention is also realized as a pneumatic type apparatus. The pneumatic type apparatus will be described below. The pressurizing means is constituted by an air cylinder for moving forth and back a plunger which is inserted in the liquid reservoir, and the air cylinder is formed to have a bore diameter greater than the inner diameter of the liquid reservoir.

With the pneumatic type apparatus, a solenoid selector valve is operated in accordance with a signal supplied from the control means, and air pressurized under a predetermined pressure is introduced tot he air cylinder, which may be of the double-acting type, thereby pressurizing the liquid in the liquid reservoir with a plunger. Further, the ejection valve is opened in timed relationship with the above operation of the pressurizing means. As a result, the liquid can be ejected through the ejection orifice under a pressure corresponding to the pressure supplied to the air cylinder without a noticeable time lag.

On the other hand, at the time when the amount of the ejected liquid that is determined depending the pressure supplied to the air cylinder, the ejection time, etc. reaches a predetermined amount, the supply of the pressurized air to the air cylinder is stopped and at the same time the ejection valve is closed under control of the control means. Accordingly, the liquid ejection can also be stopped without a noticeable time lag, and therefore the liquid can be ejected in fixed amount with good precision.

In addition, since the liquid ejection is stopped upon the ejection valve being mechanically closed, the liquid can be positively shut off and a leakage of the liquid after the closing of the ejection orifice can be very effectively prevented.

In order to improve the efficiency of ejection work by repeating the above-describe liquid ejection in fixed amount with cycles of a short tact time, it is required to raise a force imposed by the plunger for pressurizing the liquid and to increase the amount of liquid ejected per unit time.

However, because the line air pressure in a general factory is relatively low, i.e., on the order of 5 to 7 kgf/cm², the liquid pressure can not be raised as intended if the line air pressure is just supplied to the air cylinder as it is. Accordingly, there has been a limit in the efficiency of ejection work. In the pneumatic type apparatus, therefore, the bore diameter of the air cylinder is set sufficiently greater than the inner diameter of the liquid reservoir so that the plunger can provide a sufficient level of pressing force even with a relatively low pressure supplied to the air cylinder. As a result, the liquid pressure can be raised to a desired level and the tact time for ejection of the liquid in fixed amount can be shortened.

In the above case, regulation of the liquid pressure, i.e., regulation of the pressure supplied to the air cylinder in terms of direct control target, can be performed by a pressure reducing valve disposed in a pneumatic line.

The pneumatic type apparatus preferably comprises a pressure sensor provided near the ejection orifice of the ejection valve and detecting a liquid pressure, and pressure regulating means for regulating the pressure supplied to the air cylinder in accordance with a signal from the pressure sensor. The detected signal from the pressure sensor is inputted to the control means, and the control means output a pressure regulation signal to the pressure regulating means which preferably comprises an electro-pneumatic regulator, thereby operating the pressure regulating means. As a result, the pressure supplied to the air cylinder can be automatically regulated as required, and pressure variations during the liquid ejection can be automatically compensated in a prompt and smooth manner.

Also in the pneumatic type apparatus, preferably, the ejection valve comprises a needle valve.

Since the size of a needle can be made in itself sufficiently small, the needle can be smoothly and quickly displaced to open and close by a relatively small driving force even under a high liquid pressure on the order of, for example, 100 to 200 kgf/cm², without being hardly affected by the liquid pressure. It is therefore possible to shut off the liquid more positively at the end of the ejection, and to eliminate a time lag more effectively at the start and end of the ejection.

In addition, since the required driving force is relatively small, the overall size of the ejection valve can be reduced.

More preferably, the needle valve is provided with a liquid pressure compensating piston.

With this feature, the apparatus can operate so as to compensate pressure variations in the liquid passage, particularly at and near the ejection orifice, more easily, quickly and precisely in combination with back and forth movement of the liquid pressure compensating piston. One example of the combined operation is as follows. When the needle valve is opened, the volume occupied by the needle in an area near the ejection orifice is reduced. Conversely, when the needle valve is closed, the volume occupied by the needle in the area near the ejection orifice is increased. In the former case, a drop of the liquid pressure near the ejection orifice can be prevented by moving forth the liquid pressure compensating piston. In the latter case, a rise of the liquid pressure near the ejection orifice can be prevented by moving back the liquid pressure compensating piston.

Accordingly, the liquid pressure compensating piston can be employed in addition to or in place of the pressurizing means for the purpose of controlling the residual liquid pressure after the end of the ejection to the predetermined specific value.

More preferably, the liquid flow passage extended between the liquid reservoir and the ejection valve has a rising portion which extends upwardly while penetrating the plunger.

When the plunger is initially moved into the liquid reservoir, air is enclosed between a liquid surface in the liquid reservoir and the plunger which is preferably held in airtight contact with an inner surface of the liquid reservoir. However, where the liquid flow passage has the rising portion which extends upwardly while penetrating the plunger, the air enclosed above the liquid surface in the liquid reservoir is purged out of the liquid reservoir through the rising portion upon the plunger being pushed into the liquid reservoir prior to starting the liquid ejection in fixed amount. It is therefore possible to sufficiently eliminate an adverse effect of compressive property of the enclosed air upon a variation of the liquid pressure before entering the operation of ejecting the liquid in fixed amount.

To sum up, the present invention having the above-described construction operates as follows.

(1) From a method point of view, the method of the present invention comprises the step of applying a pressure to the liquid beforehand prior to starting ejection of the liquid and/or holding a pressure near an ejection orifice after the end of liquid ejection at a predetermined specific value, and from an apparatus point of view, the ejection valve includes the means for mechanically opening and closing the ejection orifice of the ejection valve. Therefore, when ejecting the liquid in relatively small fixed amount, for example, the pressure in the flow passage after the end of the ejection, particularly the pressure near the ejection orifice, is controlled to be kept at the predetermined specific value, whereby the subsequent ejection of the liquid can be always performed under the constant flow passage condition. Accordingly, by properly setting the force, time, etc. for pressurizing the liquid in the liquid reservoir, the ejection of the liquid in an amount corresponding to the set values can be repeatedly reproduced with high reliability.

The causes giving rise to a delay in ejection of the liquid reside in that it takes a time to raise the liquid pressure to a desired level, and that energy to be utilized for the ejection is consumed by deformations under pressure. Therefore, the above features of the present invention provide such advantages that pressuring the liquid prior to starting the ejection enables a desired force to act upon the liquid in a short time, and that developing deformations under pressure beforehand is effective suppressing further deformations during the ejection. As a result, energy supplied for making the liquid flow can be effectively utilized. Preferably, the pre-pressurization is carried out by applying a force equivalent to the pressure applied during the ejection, and the ejection is ended while maintaining the force equivalent to the pressure applied during the ejection.

(2) By controlling the liquid temperature to be held constant, it is possible to suppress one, more exactly, primary one of factors which cause a change of the liquid viscosity, and to eject the liquid in fixed amount with stability.

(3) By controlling the pressure of the liquid stored in the liquid reservoir, a thrust exceeding the pipe resistance developed in a nozzle is applied to act upon the liquid, and therefore an ejection rate of the liquid can be controlled to be held constant.

Because the liquid is ejected after passing a nozzle optimum for a shape to be drawn by the applied liquid, the liquid is subjected to some pipe resistance developed in the nozzle. However, controlling the pressure of the liquid stored in the liquid reservoir can produce a thrust exceeding the pipe resistance. Such control is particularly effective in the case of ejecting a highly viscous fluid in which the liquid is subjected to a very large pipe resistance. No matter how large resistance is developed, a thrust exceeding the resistance can be produced so as to act upon the liquid, and the ejection rate of the liquid can be controlled to be held constant.

(4) Control of the pressure of the liquid stored in the liquid reservoir is performed by controlling, concretely constant or variable, a rate at which the liquid stored in the liquid reservoir reduces. With the control, the ejection rate of the liquid can be held constant or as desired from the start of the ejection to the end of the ejection.

Controlling, concretely constant or variable, a rate at which the liquid stored in the liquid reservoir reduces implies that the concept of time is added to the prior art wherein time is not taken into consideration if a desired volume of the liquid is obtained, and that the volume of the ejected liquid is gradually increased in units of predetermined amount even during the process for achieving the desired volume of the liquid. As a result, the liquid can be applied regardless of viscosity of the liquid. In addition, even in the case of ejecting a highly viscous liquid that has not been preferred in practical use up to now, an adverse effect caused by resiliency of the push member and the liquid reservoir can be effectively eliminated, thus allowing these components to be employed so that the liquid can be easily applied in a desired shape with stability. Further, the ejection work can be performed at a high speed because of no need of returning the liquid pressure to the atmospheric pressure.

(5) The push member disposed to push the liquid stored in the liquid reservoir in a precise and fluid-tight manner controls the amount of the ejected liquid in accordance with a distance through which the push member moves, and also controls the flow speed of the ejected liquid in accordance with a speed at which the push member moves. Further, the liquid pressure is controlled such that the liquid is pressurized to a certain level prior to starting the ejection, and the ejection is ended under the liquid pressure higher than the atmospheric pressure, preferably when the liquid pressure is at the same pressurized level as before the start of the ejection. Therefore, adverse effects due to changes of viscosity can be eliminated, and the rate at which the liquid is ejected through the nozzle end can be controlled to be always held constant. Further, it is possible to overcome a difficulty that has been especially experienced in the prior art, i.e., precise application of the liquid so as to provide a proper form in starting and ending portions of the applied liquid line. The effect of the above feature is more effect particularly when the liquid is applied in a linear form, and a linear shape in starting and ending portions of the applied liquid line, which has been unstable in the prior art, can be very easily controlled. When the liquid should be applied in a uniform linear line, for example, the applied liquid line can be formed with a uniform width from the start point to the end point of the line without narrowing and fatting.

(6) Since the bore diameter of the air cylinder for pressing the push member is set sufficiently greater than the inner diameter of the liquid reservoir, the plunger can provide a sufficient level of pressing force even with a relatively low pressure supplied to the air cylinder. As a result, the liquid pressure can be raised to a desired level and the tact time for ejection of the liquid in fixed amount can be shortened.

(7) A motor is employed as a power source for pressing the push member, and energy generated by the motor is much greater than that required for making the liquid flow. Therefore, the moving speed of the push member can be kept constant.

(8) In addition, the present invention intends to prevent bubbles from being entrapped particularly when the liquid is filled in a syringe. The present invention also intends to eliminate the necessity of monitoring the filling process and adjusting the filling speed by a worker for the purpose of avoiding entrapment of bubbles. The present invention is featured by a fully automatic filling process. The present invention concerns with a reliable technique for ejecting a liquid in fixed amount.

(9) In particular, the present invention is applicable to any work steps for filling a liquid having a medium or higher level of viscosity. The liquid reservoir is preferably of the type that the liquid filled therein is employed by being pushed out of the reservoir end.

The liquid reservoir filled with the liquid constitutes a liquid reservoir of an apparatus comprising the liquid reservoir, liquid pressurizing means for pressurizing the liquid stored in the liquid reservoir under a pressure depending on the viscosity of the liquid, and an ejection valve communicating with the liquid reservoir, thereby ejecting the liquid in fixed amount from the liquid reservoir through the ejection valve.

With the present invention having the above-described construction, the following advantages are expected.

(1) A method and apparatus can be provided which can eject or apply a very small amount of liquid in a desired form at a high speed and precisely without depending on viscosity of the liquid. Particularly, even when employing a highly viscous liquid or applying a liquid at a high speed, a shape of the applied liquid line can be very easily controlled in starting and ending portions of the applied liquid line. For example, when the liquid should be applied in a linear uniform shape, the applied liquid line can be formed with a uniform width from the start point to the end point of the line without narrowing and fatting.

(2) The liquid can be more positively shut off at the time of stopping the liquid ejection without a risk of breaking fillers, and a leakage of the liquid can be securely avoided.

(3) A liquid ejecting or applying method and apparatus can be provided which enables an applied liquid to be drawn in a uniform line without taking a time until a flow speed of the liquid reaches a certain value.

(4) When filling a liquid in the liquid reservoir, particularly in a syringe, the liquid can be filled without entrapping bubbles while realizing a fully automated manner.

BRIEF DESCRIPTION OF THE DRAWINGS

Referring to FIG. 2, reference numeral $P_A$ denotes pressure in liquid reservoir after ejection; $P_B$ denotes pressure in liquid reservoir before ejection; $C_N$ denotes number of times at which conditions are met; N denotes reference value for determination about number of times at which conditions are met; $P_{TEMP}$ denotes measured pressure; $P_{A(M)}$ denotes pressure data stored in memory (Automatically regulated pressure target value).

FIG. 10 is a sectional view showing another embodiment of the needle valve used in the present invention;

BEST MODE FOR CARRYING OUT THE INVENTION

Details of the present invention will be described below in conjunction with embodiments. It is to be understood that the present invention is limited in no way by the following embodiments.

Embodiment 1

An apparatus for carrying out the present invention, details of apparatus components, and operations of the components will be described with reference to FIGS. 1 to 18.

Figure 1:
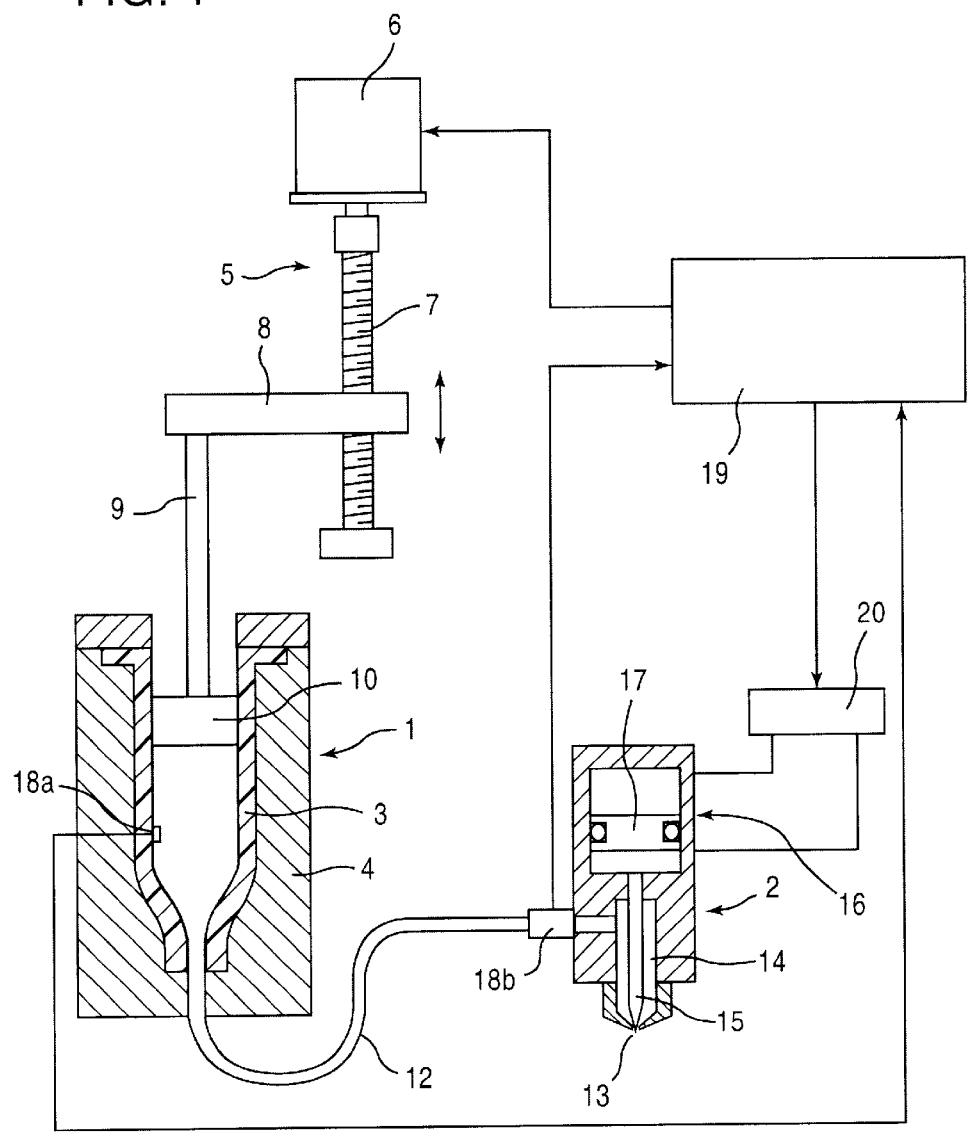
FIG. 1 is a schematic view, sectioned in principal part, showing an embodiment of a fixed-amount-of-liquid ejecting method and apparatus according to the present invention, the embodiment using a screw transmitting device as pressurizing means.

FIG. 1 is a schematic view, sectioned in principal part, showing an embodiment of a fixed-amount-of-liquid ejecting method and apparatus according to the present invention, the embodiment using a screw transmitting device as pressurizing means. As shown in FIG. 1, a liquid reservoir 1 comprises a syringe 3 which can be made of a synthetic resin material, for example, and a holder 4 surrounding the syringe 3 in contact relation from the outer side so as to hold it. The syringe 3 is detachably attached to the holder 4. The liquid reservoir 1 is provided with a pressure sensor 18a for measuring a pressure in the liquid reservoir 1 and outputting a measured result as a control signal.

A pressurizing means 5 for pressurizing a liquid in the liquid reservoir 1 to a required level of pressure is constructed such that a ball screw 7 is mounted to an output shaft of a motor 6, a female screw member 8 is meshed with the ball screw 7 to be movable up and down with rotation of the ball screw 7, and a plunger 10 is coupled to the female screw member 8 through a rod 9. The plunger 10 is preferably held in liquid tight contact with an inner surface of the syringe 3.

A needle valve 2 connected to the liquid reservoir 1 through a liquid flow passage 12 comprises an outlet space 14 communicating with the liquid flow passage 12 and leading to an ejection orifice 13, a needle 15 movable back and forth in the outlet space 14 to thereby open and close the ejection orifice 13, and a double-acting cylinder 16 for moving the needle 15 back and forth. The needle 15 is coupled to a piston 17 of the cylinder 16.

At a position near the ejection orifice 13, i.e., at a portion where the needle valve 2 is connected to the flow passage 12 in the arrangement shown in FIG. 1, a pressure sensor 18b is disposed to detect a pressure of the liquid in the flow passage 12. A detection signal from the pressure sensor 18b is inputted to a control means 19.

The control means 19 in this embodiment comprises an input/output unit, a processing unit and a storage unit, and functions to control the operation of the motor 6 in accordance with detected results of the pressure sensors 18a and 18b so that the ejection pressure at the start of liquid ejection is automatically adjusted, and that the liquid pressure in the flow passage 12, particularly in the position near the ejection orifice, is held at a predetermined specific value when the liquid ejection is stopped, more preferably also when the liquid is ejected. Another function of the control means 19 is to control the speed and cycle time of rotation of motor 6, etc. at the time when the liquid is ejected, as well as the operation of a selector valve 20 for the needle valve 2.

With the apparatus thus constructed, the liquid is ejected in fixed amount as follows. In accordance with the pressures detected by the pressure sensors 18a and 18b, for example, the control means 19 operates the motor 6 to move the plunger 10 up or down in the syringe 3, whereby the liquid pressure in the flow passage 12 is held at the predetermined specific value. As a result, a flow passage condition before the start of liquid ejection is always kept constant. Subsequently, with an ejection start signal and an ejection pressure signal outputted from the control means 19, the motor 6 is rotated at a constant predetermined speed to pressurize the liquid in the syringe 3 to a required level of pressure. Also, the piston 17 of the syringe 16 and hence the needle 15 are moved back in timed relationship with the operation of the motor 6. The ejection orifice 13 is thereby opened to start the liquid ejection through the ejection orifice 13.

When the liquid is ejected for a relatively long period of time, it is preferable for the purpose of improving the precision of liquid ejection in fixed amount that the liquid pressure is also detected with the pressure sensor 18b during the liquid ejection, and a detected result is fed back to the control process for the operation of the motor 6 to regulate the speed of rotation thereof, etc.

When a predetermined time corresponding to the liquid ejection in predetermined amount has lapsed, the control means 19 outputs an ejection end signal to each of the motor 6 and the selector valve 20, thereby stopping the rotation of the motor 6 and closing the needle valve 2 at the same time. One cycle of the liquid ejection in fixed amount is thereby completed.

With the above arrangement, it is always particularly ensured regardless of the magnitude of the liquid pressure that the needle 15 of the needle valve 2 is operated to move forth smoothly and quickly for mechanically closing the ejection orifice 13. It is therefore possible to achieve good shutting-off of the liquid, to realize complete closing of the ejection orifice 13, and to avoid an accidental leakage of the liquid sufficiently.

Figure 2:
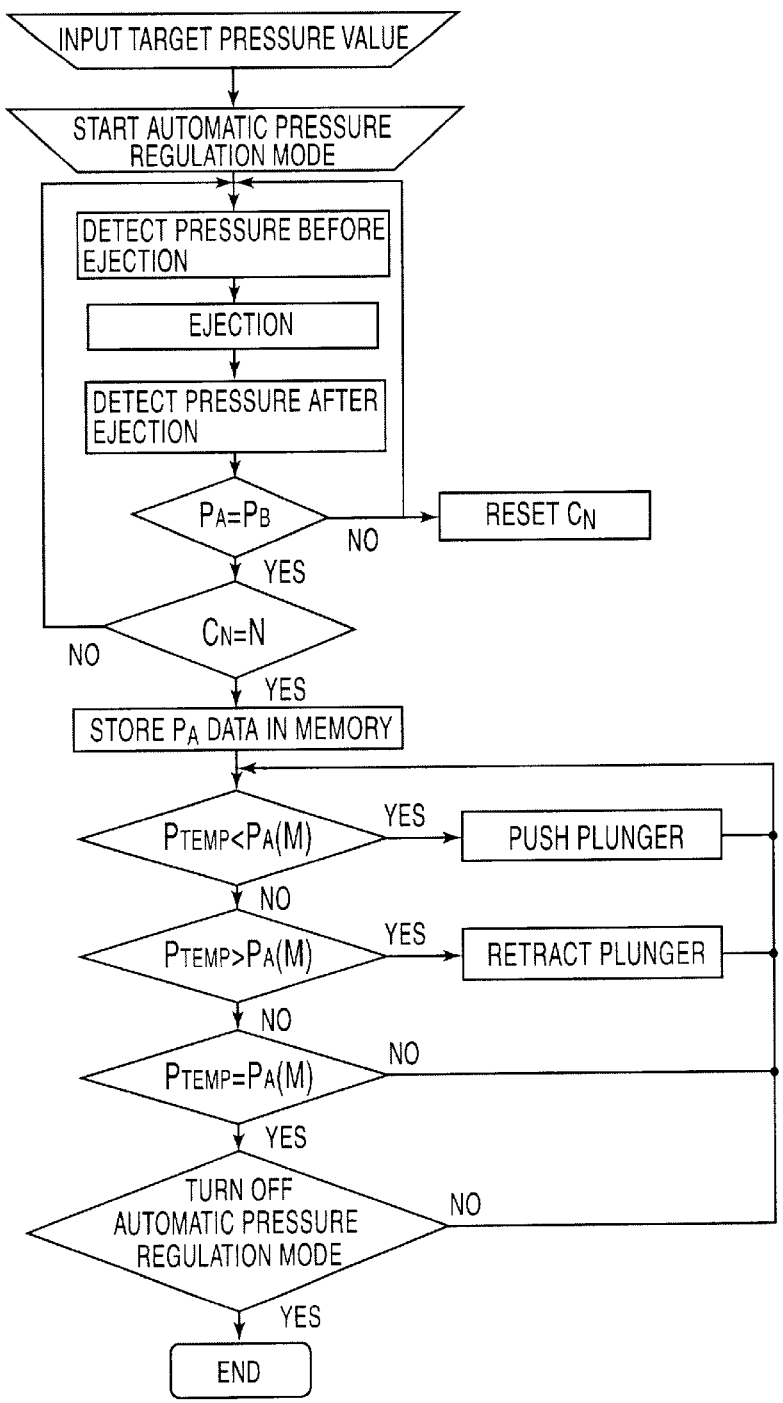
FIG. 2 is a flowchart of processing steps in the embodiment.

FIG. 2 is a flowchart of processing steps carried out in the automatic pressure regulating device having the above-described construction. When the operation is started after inputting an ejection target pressure Pm to the control means 19, the pressure sensor 18a detects a pressure $P_B$ in the liquid reservoir 1 before the start of liquid ejection and sends a detected value to the control means 19 (step 3). In response to the input signal, the control means 19 causes the liquid to be ejected through the ejection orifice 13 of the needle valve 2 for a short time. After that liquid ejection, the pressure sensor 18a detects a pressure $P_A$ in the liquid reservoir and sends a detected value to the control means (step 5). In accordance with to the inputted pressure value, the processing unit of the control means 19 computes a change of pressure in the liquid reservoir 1 between before and after the liquid ejection (step 6). If both the detected values are not coincident with each other, then the control means 19 issues an actuation signal to the pressurizing means 5 to move the plunger 10 of the pressurizing means 5 just a small distance for fine adjustment of the pressure in the liquid reservoir 1. After that, the control means 19 returns to the step 3 to compare the pressure in the liquid reservoir 1 between before and after the liquid ejection again. Depending on a comparison result, the control means 19 carries out the above-described processing again. Such processing is repeated until the pressure $P_A$ and pressure $P_B$ coincide with each other. If it is determined in the step 6 that the pressure $P_A$ in the liquid reservoir 1 after the liquid ejection and pressure $P_B$ in the liquid reservoir 1 before the liquid ejection coincide with each other, then the control means 19 temporarily stores the pressure value at that time in its memory and sets a count value of a counter for counting the number of times of coincidence to 1. Subsequently, the control means 19 determines whether a coincidence signal has been inputted in succession and the number of inputted coincidence signals reaches a predetermined value (step 7).

At the start of the operation, the counter is set to a value 1. The predetermined value is set to determine whether the coincidence between the pressure $P_A$ and the pressure $P_B$ is momentary or continuous. Therefore, the predetermined value is not set to a value larger than 1 because the value 1 makes it impossible to determine whether the coincidence between the two pressures is momentary or continuous. In other words, when the number of times of coincidence is 1, this means that the counted value does not reach the predetermined value. If the number of times of coincidence does not reach the predetermined value, then the control means 19 returns to the step 3 to repeat the above-described processing. If it is determined in the step 6 that the pressure $P_A$ and the pressure $P_B$ coincide with each other, then the control means 19 further determines the pressure value at that time is equal to the previous pressure value. If both the pressure values are equal to each other, then the count value of the counter is incremented by one. If both the pressure values are not equal to each other, then the control means 19 returns to the step 3 and at the same time resets the count value of the counter. If the number of times of coincidence reaches the predetermined value after repeating the above-described processing, then the pressure in the liquid reservoir at that time is stored as an automatically regulated pressure target value $P_{(A)}M$ in the memory (step 8). After the decision of the automatically regulated pressure target value, the control means 19 proceeds to a next step. More specifically, the pressure sensor 18b disposed near the ejection orifice 13 of the needle valve 2 detects an ejection pressure $P_{TEMP}$ and inputs it to the control means 19 which compares the inputted value with the automatically regulated pressure target value $P_{(A)}M$. If the measured ejection pressure $P_{TEMP}$ is smaller than the automatically regulated pressure target value $P_{(A)}M$, then the control means 19 transmits a signal to move down the plunger (step 9). If the measured ejection pressure $P_{TEMP}$ is greater than the automatically regulated pressure target value $P_{(A)}M$, then the control means 19 transmits a signal to move up the plunger (step 10). In either case, the plunger is moved through a prescribed distance, and the above processing is repeated until the measured ejection pressure $P_{TEMP}$ coincides with the automatically regulated pressure target value $P_{(A)}M$. Furthermore, in this embodiment, the control means 19 determines in step 11 again as to whether the measured ejection pressure $P_{TEMP}$ is equal to the automatically regulated pressure target value $P_{(A)}M$, for the purpose of ensuring more positive pressure regulation.

Through the above-described processing, regulation of the ejection pressure necessary in the initial stage of the operation can be achieved. By holding the apparatus in such an automatic pressure regulation mode, the processing of the steps 9 to 11 is continuously repeated following the step 12 throughout the operation, and therefore more precise regulation of the ejection pressure is achieved.

Figure 3:
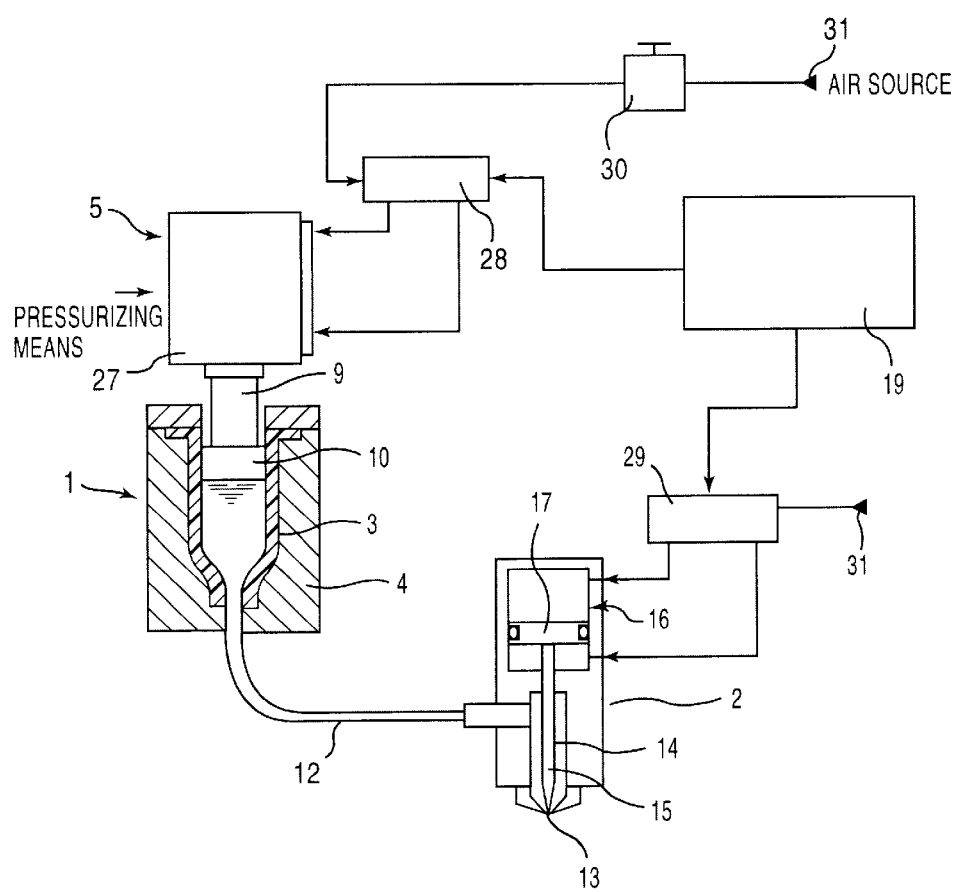
FIG. 3 is a schematic view, sectioned in principal part, showing an embodiment of the fixed-amount-of-liquid ejecting method and apparatus according to the present invention, the embodiment using an air cylinder as pressurizing means.

FIG. 3 is a schematic view, sectioned in principal part, showing an embodiment of the fixed-amount-of-liquid ejecting method and apparatus according to the present invention, the embodiment using an air cylinder as pressurizing means. A liquid reservoir 1 shown in FIG. 3 comprises a syringe 3 which can be made of a synthetic resin material, for example, and a holder 4 surrounding the syringe 3 in contact relation from the outer side so as to hold it. The syringe 3 is detachably attached to the holder 4 as necessary. A pressurizing means 5 for pressurizing a liquid in the liquid reservoir 1 to a required level of pressure is constructed, in this embodiment, by an air cylinder 27 having a bore diameter about 2 to 10 times as large as the inner diameter of the syringe 3. A plunger 10 is attached to a fore end of a piston rod 9 of the air cylinder 27. The plunger 10 is preferably allowed to enter the syringe 3 while it is held in liquid tight contact with an inner surface of the syringe 3.

A needle valve 2 connected to the liquid reservoir 1 through a liquid flow passage 12 comprises an outlet space 14 communicating with the liquid flow passage 12 and leading to an ejection orifice 13, a needle 15 movable back and forth in the outlet space 14 to thereby open and close the ejection orifice 13, and a double-acting cylinder 16 for moving the needle 15 back and forth. The needle 15 is coupled at its rear end to a piston 17 of the cylinder 16.

Further, the air cylinder 27, which may also be of the double-acting type, and the double-acting cylinder 16 are connected respectively to solenoid selector valves 28, 29. The solenoid selector valves 28, 29 are connected to a control means 19 for controlling the operations of the valves 28, 29 in accordance with time signals previously inputted to the control means 19. In addition, one solenoid selector valve 28 for controlling supply and discharge of pressurized air to and from the air cylinder 27 is connected to a pressurized air supply source 31 through, e.g., a manual pressure reducing valve 30, whereas the other solenoid selector valve 29 is directly connected to the pressurized air supply source 31.

In the fixed-amount-of-liquid ejecting apparatus thus constructed, the liquid is ejected in fixed amount as follows. The control means 19 outputs signals to the solenoid selector valves 28 and 29. In response to the signal outputted to the solenoid selector valve 28, the pressurized air is supplied to the air cylinder 27 at a pressure set by the manual pressure reducing valve 30, thereby moving the plunger 10 downward with a required force. In timed relationship with the above operation, the needle valve 2 is opened in response to the signal outputted to the solenoid selector valve 29, and the liquid pressurized to a required level of pressure is ejected through the ejection orifice 13 for a certain period of time that is specified depending on an opening area of the ejection orifice 13. As a result, the liquid can be ejected in fixed amount with high precision without a time lag.

At the end of the liquid ejection in fixed amount, an ejection end signal is sent to each of the solenoid selector valves 28, 29 from the control means 19, whereupon the supply of the pressurized air to the air cylinder 27 is stopped, and at the same time the ejection orifice 13 of the needle valve 2 is mechanically closed by the needle 15 with certainty. An outflow of the liquid through the ejection orifice 13 is therefore perfectly stopped upon closing of the needle valve 2. As a result, a risk of liquid leakage during the state in which the needle valve 2 is closed can be securely eliminated.

Moreover, the needle 15 of the needle valve 2 is small in size and volume, and is operated to move back and forth always smoothly and quickly for mechanically opening and closing the ejection orifice 13 regardless of the magnitude of the liquid pressure. Consequently, not only positive opening and closing of the needle valve 2 but also a good response can be realized.

Figure 4:
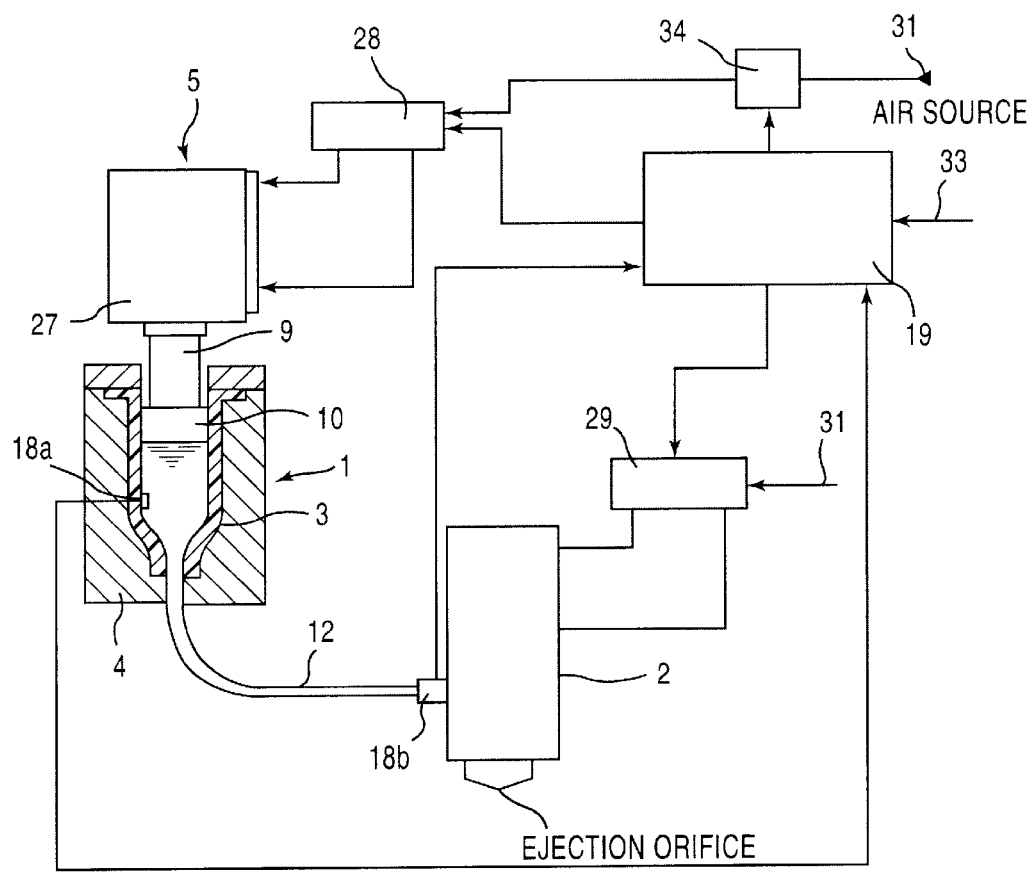
FIG. 4 is a schematic view, sectioned in principal part, showing another embodiment of the fixed-amount-of-liquid ejecting method and apparatus according to the present invention, the embodiment using an air cylinder as pressurizing means.

FIG. 4 is a schematic view, sectioned in principal part, showing another embodiment of the fixed-amount-of-liquid ejecting method and apparatus according to the present invention, the embodiment using an air cylinder as pressurizing means. In this embodiment, a liquid reservoir 1 is provided with a pressure sensor 18a, and a pressure sensor 18b for detecting a liquid pressure is disposed at a position near the ejection orifice 13 of the needle valve 2 which may or may not include a liquid pressure compensating piston 21 (described later), e.g., at a portion, as shown in FIG. 4, from which the liquid flows into the needle valve 2. Respective detection signals of the pressure sensors 18a and 18b are inputted to a control means 19. Based on the pressure to be supplied to an air cylinder 27 and an external setting signal 33 for the liquid pressure, the control means 19 outputs a pressure regulation signal depending on the detection signals from the pressure sensors 18a and 18b to a pressure regulating means, preferably an electro-pneumatic regulator 34, which is disposed in a pressurized air supply path.

With the apparatus of this embodiment, when a pressure change during the operation of ejecting the liquid in fixed amount is detected by the pressure sensor 18a or 18b, the electro-pneumatic regulator 34 is operated to regulate the pressure supplied to the air cylinder 27. As a result, variations in the liquid pressure can be automatically compensated in accordance with the external setting signal 33. Furthermore, by modifying the external setting signal 33 itself, the pressure of the liquid supplied to the needle valve 2 can be changed as required.

Figure 5:
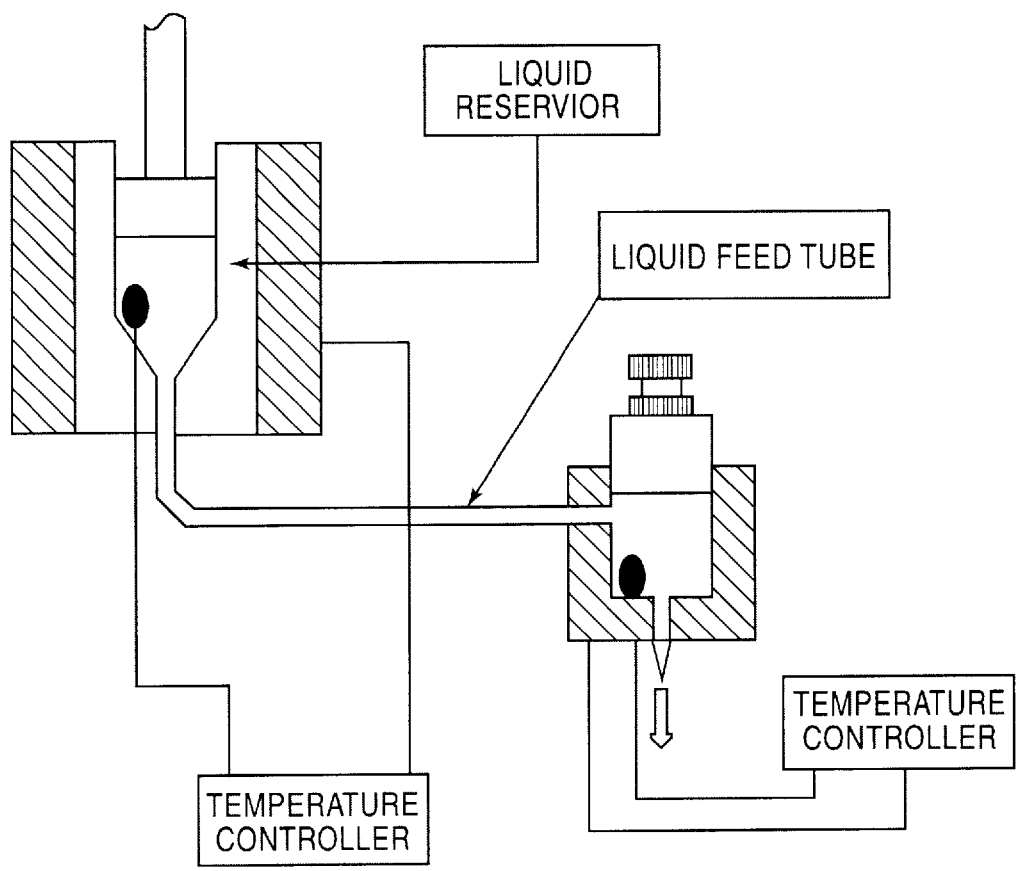
FIG. 5 is a schematic view for explaining an embodiment in which the apparatus shown in any of FIGS. 1, 3 and 4 is additionally provided with liquid temperature control means.

FIG. 5 is a schematic view for explaining an embodiment in which the apparatus shown in any of FIGS. 1, 3 and 4 is additionally provided with liquid temperature control means. An apparatus of this embodiment includes temperature sensors disposed respectively in the liquid reservoir and the ejection valve for measuring liquid temperatures therein, temperature controllers for receiving signals from the temperature sensors and outputting signals to heating/cooling units, and the heating/cooling units heated and cooled in accordance with the signals supplied from the temperature controllers so as to maintain desired temperatures. The liquid reservoir and the ejection valve are covered by the respective heating/cooling units. The liquid temperature is always controlled to be held at the desired temperature. Specifically, the liquid temperature in the liquid reservoir and the liquid temperature in the ejection valve are managed at all times by the corresponding temperature controllers. Where a liquid feed tube communicating the liquid reservoir and the ejection valve extends over a long distance, or where the ejection interval is long and the liquid passes through the liquid feed tube while it takes such a long time as causing a change of the liquid temperature during the feed, it is desired that an additional temperature sensor is disposed midway the liquid feed tube and a part or the whole of the liquid feed tube is covered by another heating/cooling unit. In this case, the number of temperature sensors disposed midway the liquid feed tube is preferably determined depending on the length of the liquid feed tube and the ejection interval. A similar advantage can also be obtained by installing the entirety of the apparatus in a thermostatic chamber which can control a temperature therein so as to be maintain at the desired temperature.

Figure 6:
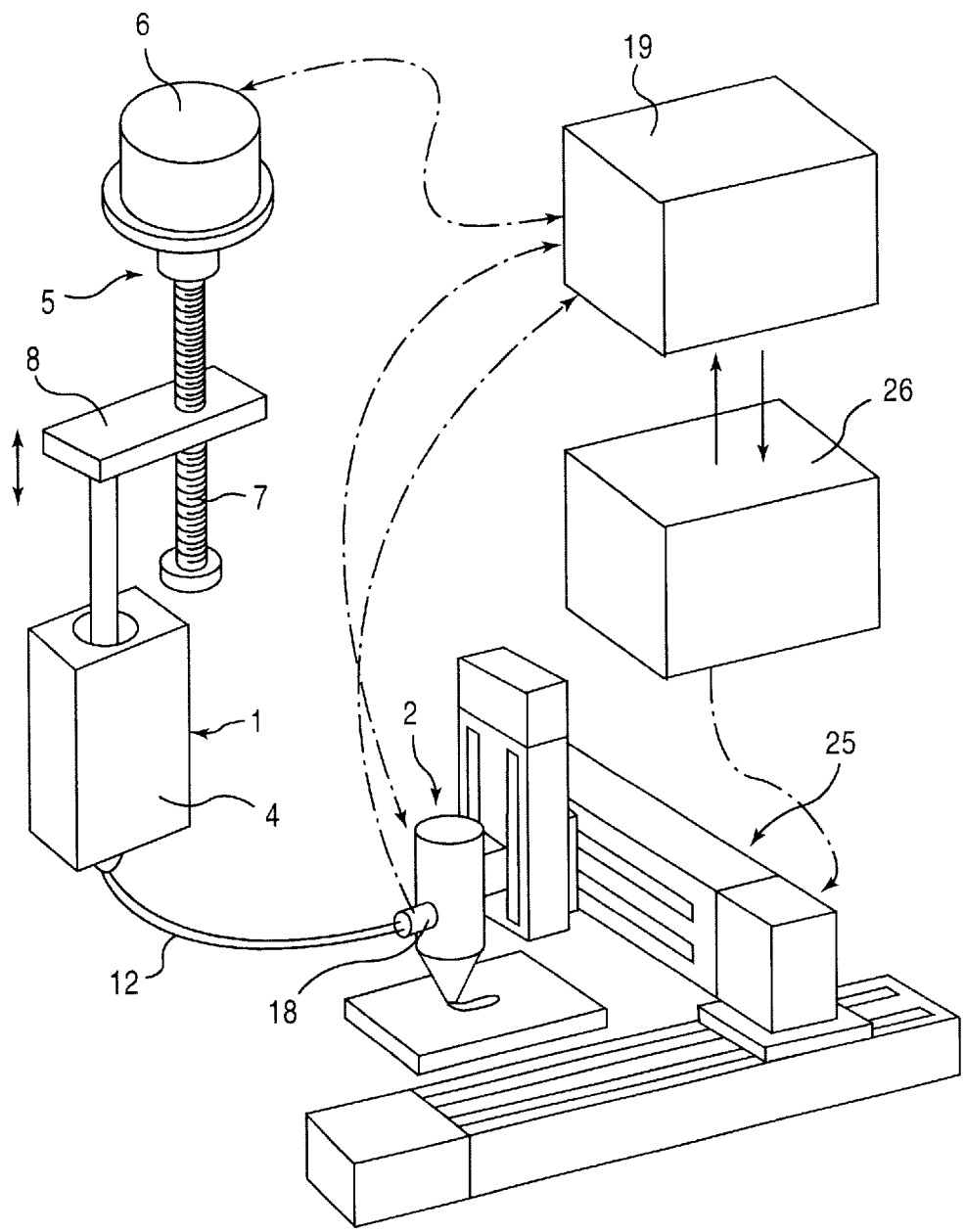
FIG. 6 is a schematic perspective view showing an embodiment in which the present invention is applied to a three-dimensional manipulator.

FIG. 6 is a schematic perspective view showing an embodiment in which the present invention is applied to a three-dimensional manipulator. When a workpiece, i.e., an object to which a liquid is to be applied, is displaced in proper timed relationship with the liquid ejection, the fixed-amount-of-liquid ejecting apparatus including the valve mechanism described above can be employed in such a manner that the position of a nozzle functioning as the ejection valve can be kept stationary during use.

However, when a workpiece is positioned and fixed at a particular position, the nozzle must be moved in desired directions and to desired positions. In such a case, the nozzle is mounted to a three-dimensional manipulator 25 based on the Cartesian coordinate system, and the three-dimensional manipulator is operated by a controller 26 which outputs a position signal in accordance with a signal from the control means. The ejection orifice of the nozzle is thereby moved to a desired position in the three-dimensional coordinate system. The apparatus of this embodiment can provide good applying efficiency when employed for workpieces that are fed at a predetermined rate (tact) with a conveyor, for example.

Figure 7:
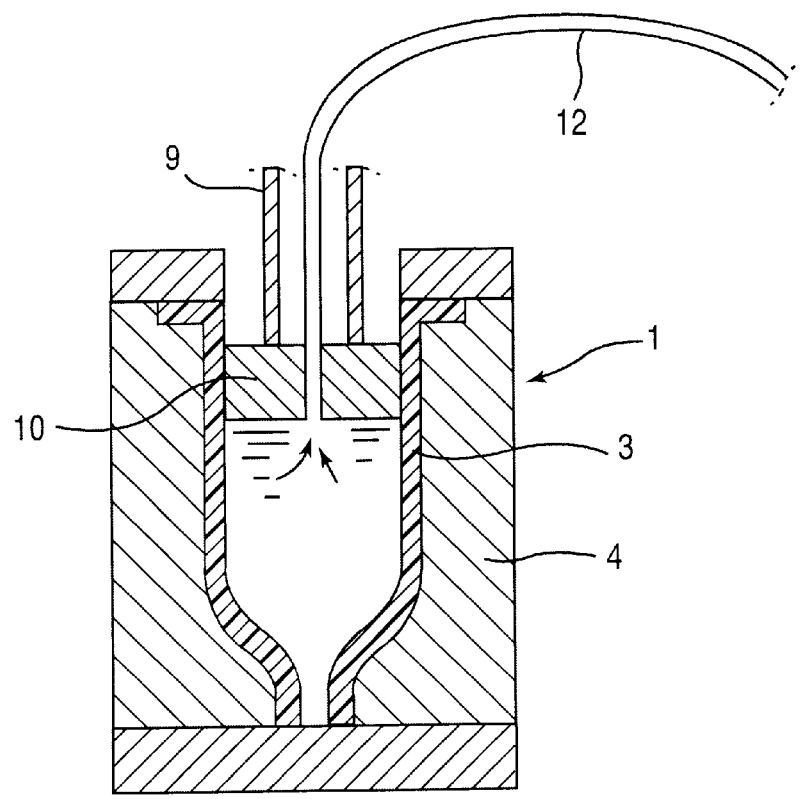
FIGS. 7 and 8 are sectional views showing other embodiments of a liquid reservoir used in the present invention.

FIG. 7 is a sectional view showing another embodiment of the liquid reservoir used in the present invention. In this embodiment, a liquid flow passage 12 is formed to extend upwardly of the liquid reservoir 1 after penetrating a plunger 10. The liquid flow passage 12 in this embodiment is suitably used for a liquid containing many precipitates in point of effectively preventing the precipitates being ejected with the liquid.

Figure 8:
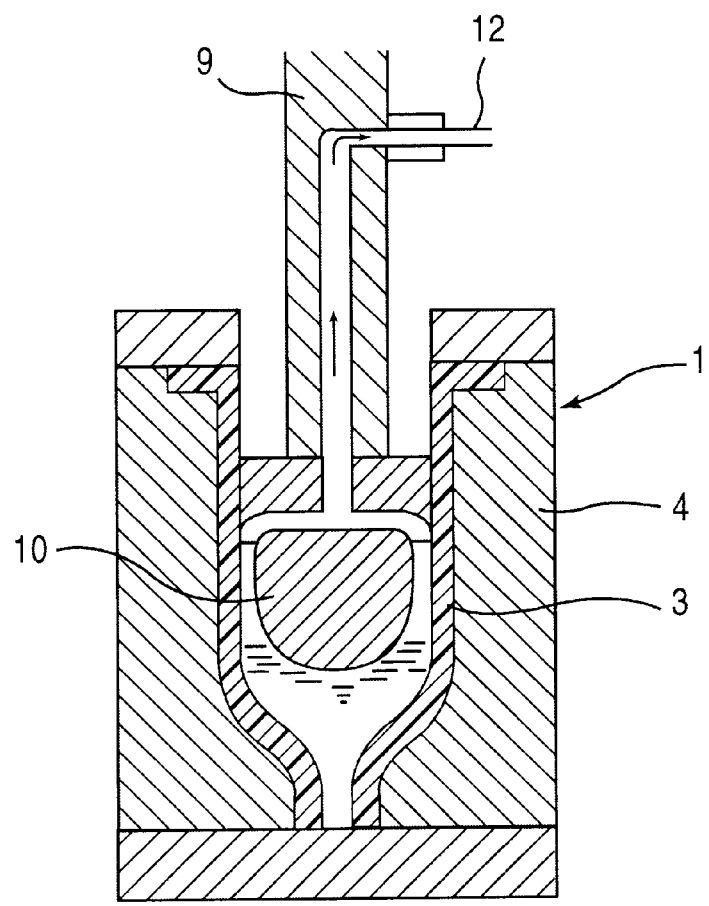

FIG. 8 is a sectional view, similar to FIG. 7, showing still another embodiment of the liquid reservoir used in the present invention. In this embodiment, a plunger 10 has a lower surface formed to have a configuration close to the bottom shape of the syringe 3. With this embodiment, a space remaining in the syringe when the plunger 10 is fully descended to a lower limit position can be reduced, and therefore the consumption efficiency of the liquid can be increased. Further, sealed air can be more easily and surely discharged toward the valve through a liquid flow passage 12 opened at the side of the plunger 10 as shown.

Figure 9:
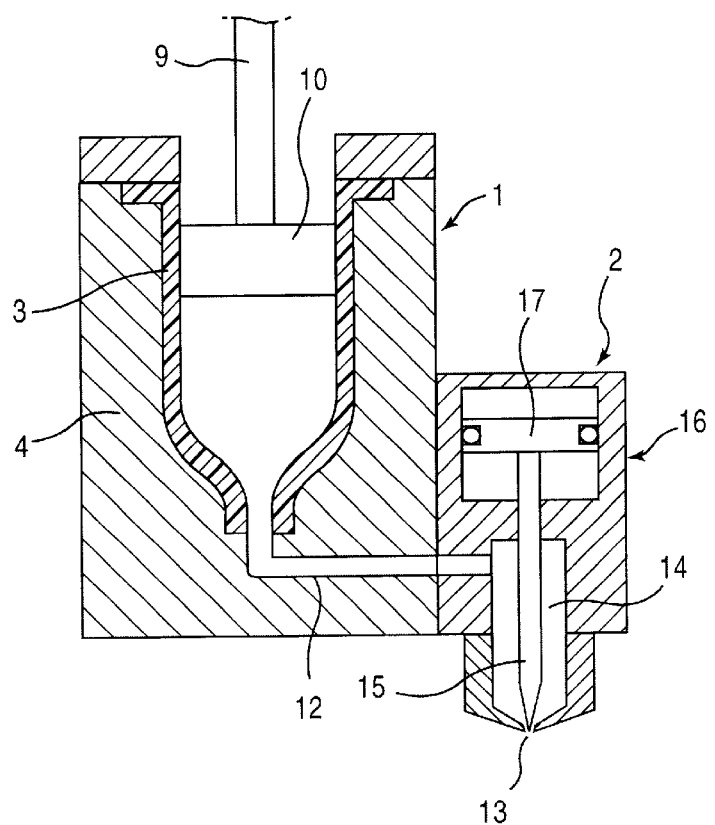
FIG. 9 is a sectional view showing another embodiment of an arrangement of the liquid reservoir and a needle valve which are used in the present invention.

FIG. 9 is a sectional view showing another embodiment of an arrangement of the liquid reservoir and the needle valve which are used in the present invention. In this embodiment, a liquid flow passage 12 is formed in the body of the holder 4 of the syringe 3 to be communicated with a lower end opening of the syringe 3 and an inner passage of the needle valve 2. With this embodiment, the liquid reservoir 1 and the needle valve 2 are constructed into a one-piece structure and, therefore a tube for forming a flow passage between the liquid reservoir 1 and the needle valve 2 is no longer required. As a result, it is possible to prevent a pressure response from lowering due to a long flow passage between them.

Figure 10:
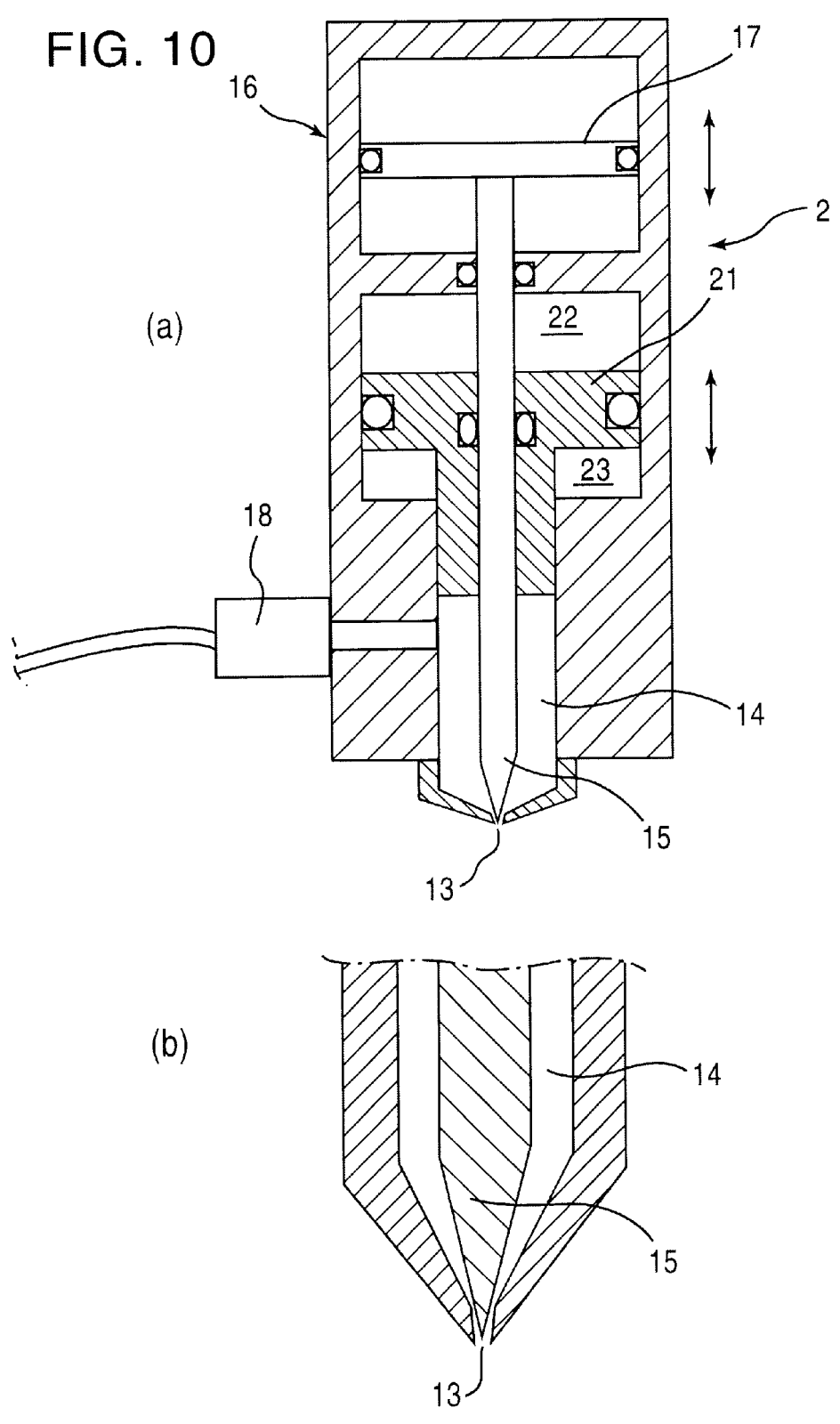

FIG. 10 is a sectional view showing another embodiment of the needle valve used in the present invention. In a needle valve 2 of this embodiment, a liquid pressure compensating piston 21 for defining the outlet space 14 is disposed independently of the double-acting cylinder 16 between the outlet space 14 and the cylinder 16. The liquid pressure compensating piston 21 functions as follows. When the piston 21 is moved forth with a pressurized fluid, e.g., pressurized air, supplied to a chamber 22 on the same side as the cylinder 16, the volume of the outlet space 14 is reduced. On the other hand, when the piston 21 is moved back with pressurized air supplied to a chamber 23 on the same side as the outlet space 14, the volume of the outlet space 14 is increased.

Accordingly, the predetermined liquid pressure can be realized by moving the liquid pressure compensating piston 21 forth to some extent when the liquid pressure near the ejection orifice 13, which is detected by a pressure sensor 18, is lower than the predetermined value, and by moving the liquid pressure compensating piston 21 back to some extent when the liquid pressure near the ejection port 13 is higher than the predetermined value.

For example, minute pressure variations can be effectively compensated as follows. A drop of the liquid pressure due to a reduction of the volume occupied by the needle 15 in the outlet space 14, which occurs when the needle 15 is moved back at the time of starting the ejection of the liquid, can be absorbed by moving the liquid pressure compensating piston 21 forth. Conversely, a rise of the liquid pressure due to an increase of the volume occupied by the needle 15 in the outlet space 14, which occurs when the needle 15 is moved forth at the time of stopping the ejection of the liquid, can be absorbed by moving the piston 21 back.

To more positively shut off the liquid in each of the needle valve shown in FIG. 10 and the needle valve in the above embodiments at the time when the ejection orifice 13 is closed, it is preferable that the length of a wall portion of the ejection orifice 13, which projects downward from the position where the needle 15 is seated against it, be as small as possible to make substantially zero the amount of the liquid remaining in the ejection orifice 13 after the ejection orifice 13 has been closed.

When a workpiece, i.e., an object to which a liquid is to be applied, is displaced in proper timed relationship with the liquid ejection, the fixed-amount-of-liquid ejecting apparatus described above can be employed in such a manner that the position of the needle valve 2 serving as the ejection valve can be kept stationary during use.

However, when a workpiece is positioned and fixed at a particular position, the needle valve 2 must be moved in desired directions and to desired positions.

Figure 11:
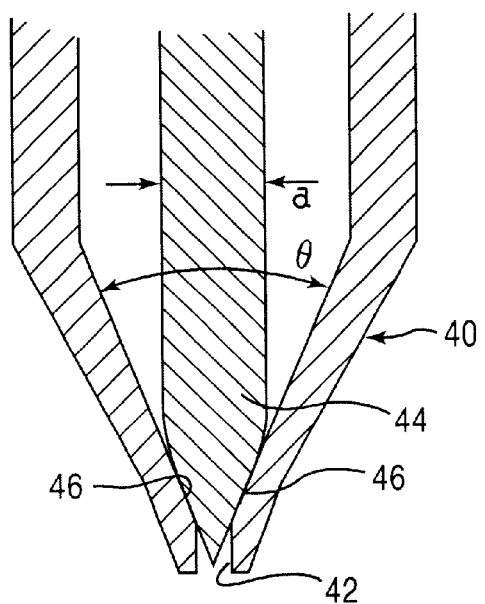
FIG. 11 is a sectional view showing still another embodiment of the needle valve used in the present invention.
Figure 12:
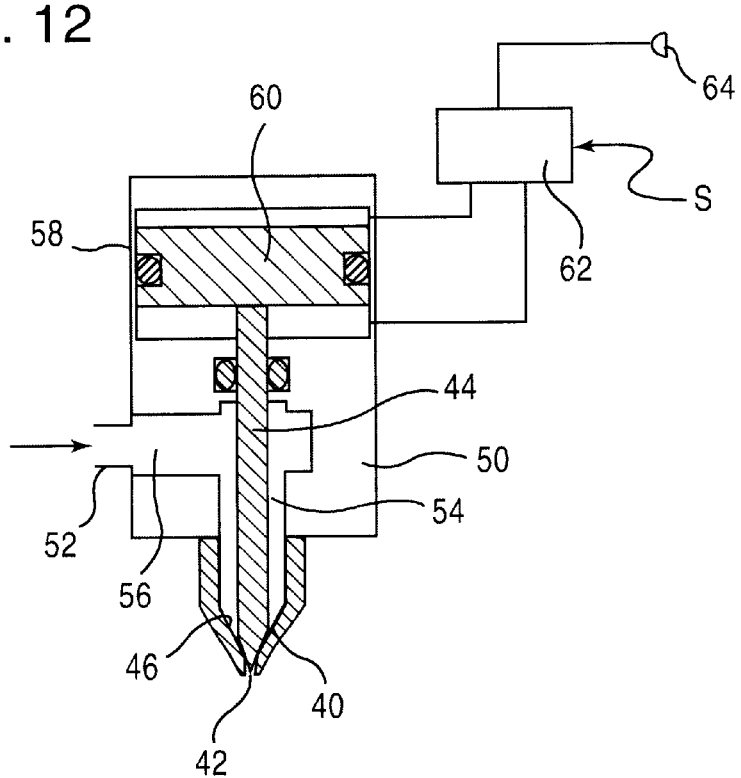
FIG. 12 is a schematic view of a driving circuit for the needle valve shown in FIG. 11.

FIG. 11 is a sectional view showing still another embodiment of the needle valve used in the present invention, and FIG. 12 is a schematic view showing an embodiment in which a nozzle having a valve construction as shown in FIG. 11 is attached to the fixed-amount-of-liquid ejecting apparatus. Prior to describing FIGS. 11 and 12 individually, the matters common to both the drawings will be first described.

A fixed-amount-of-liquid ejecting apparatus is used in, for example, semiconductor manufacturing processes for regularly or irregularly coating an electronic material, e.g., a paste, on a board in the form of points and lines. In such a fixed-amount-of-liquid ejecting apparatus, a liquid is pushed out from a liquid reservoir by pressurizing means such as a piston, and the amount of liquid ejected through an ejection valve is controlled depending on a degree at which the ejection valve is opened/closed, and an opening/closing time of the ejection valve, etc. There are known various types of ejection valves. A proper one of those ejection valves is selectively employed depending on the type of liquid to be ejected, the amount of liquid to be ejected per unit time, etc. An ejection valve called a needle valve, in particular, comprises a needle valve stem movable disposed in a liquid chamber and having an acutely pointed end, and a valve seat provided so as to receive an end portion of the needle valve stem and having a small opening formed at the center thereof for communication with an ejection orifice. Liquid ejection is stopped when the end portion of the needle valve stem closes the opening formed at the center of the valve seat, and liquid ejection is permitted when the end portion of the needle valve stem departs away from the opening formed at the center of the valve seat. The needle valve therefore has such a characteristic that an effective cross-sectional area of the opening in the valve seat is less changed with respect to small stroke adjustment of the needle valve stem. Because of that characteristic, the needle valve is regarded suitable for ejecting a very small amount of liquid. One of those needle valves is disclosed in Japanese Patent Application No. 10-309179 (filing data: Oct. 29, 1998) entitled "Fixed-amount-of-liquid Ejecting Apparatus" and filed by the applicant.

When ejecting a liquid in fixed amount by using such a needle valve, it is customary that the applying or filling operation is performed after fitting a nozzle (very thin pipe), which is adapted for individual ejection works, to an ejection orifice.

In the case of ejecting a liquid in fixed amount with the nozzle fitted to the ejection orifice, particularly in the case of ejecting a liquid having a medium or high level of viscosity, when liquid ejection is controlled by opening and closing the valve, there frequently occurs a phenomenon (called post-dripping) that the liquid remains continuously ejected through the tip of the very thin pipe even after the valve is closed.

It is confirmed that the above phenomenon occurs regardless of whether bubbles are mixed in the liquid. The above phenomenon is presumably primarily attributable to the fact that because of resistance developed in the pipe between the valve seat and the nozzle, i.e., an end opening of the ejection orifice, the liquid pressurizing force required for the liquid ejection remains there, and the liquid continues to be ejected until the remaining pressure is completely eliminated.

Looking from a point of applying operation, such a phenomenon appears as poor shut-off of the liquid just after ejection. In the case of ejecting a highly viscous liquid material, particularly, there occurs a phenomenon called roping when the very thin pipe is moved from one applying point to another. This results in a problem that a workpiece to which the liquid material has been applied is stained and hence rejected.

A primary object of this embodiment of the present invention is to solve the problems experienced in a conventional apparatus for ejecting a liquid in fixed amount using a nozzle like the above-mentioned one. Particularly, the present invention intends to overcome such problems as poor shutting-off and leakage of the liquid, and to provide a nozzle for a fixed-amount-of-liquid ejecting apparatus which can eject a very small amount of liquid and stop ejection of the liquid with high precision.

According to this embodiment of the present invention, in a nozzle for a fixed-amount-of-liquid ejecting apparatus for ejecting a liquid introduced to a liquid receiving portion under pressure and stopping ejection of the liquid, the nozzle includes a valve mechanism in a space within a nozzle body communicating with the liquid receiving portion.

With the above construction, the problems experienced in a conventional apparatus, such as liquid dripping and roping, can be perfectly eliminated, and good shutting-off of the liquid. In addition, an accidental leakage of the liquid after stopping the liquid ejection can be perfectly prevented.

In the above nozzle, preferably, the nozzle body has an orifice for ejection of the liquid and the valve mechanism is disposed near the ejection orifice.

Also, preferably, the valve mechanism comprises a valve stem movably disposed in the nozzle body, and a valve seat formed by an inner wall surface of the nozzle near the ejection orifice.

Further, preferably, the valve stem has a tip formed into a needle-like shape, and a peripheral surface of the valve stem tip is formed so as to be held in close contact with the nozzle inner wall surface along substantially circular contact line.

With the above construction, the position at which the valve is opened and closed can be made substantially coincident with the position of an end opening of the liquid ejection orifice, and the end opening of the liquid ejection orifice can be directly and physically opened and closed. Therefore, the liquid can be ejected in fixed amount and in desired pattern at a high speed with high precision.

FIG. 11 is a sectional view showing still another embodiment of the needle valve used in the present invention. In this embodiment, the needle-like valve stem for opening and closing the valve is operated by an air cylinder. Referring to FIG. 11, reference numeral 40 denotes a nozzle body having a liquid ejection orifice 42 formed at its lower end. A needle-like valve stem 44 is disposed in an inner space of the nozzle 40 movably in the vertical direction, and a valve seat 46 for receiving a tip of the valve stem is formed by a nozzle inner wall surface near the ejection orifice 42. The valve stem 44 and the valve seat 46 cooperatively constitute a valve mechanism. Specifically, a part of the inner wall surface of the nozzle 40 near the ejection orifice 42 functions as the valve seat 46, and a peripheral surface of the tip of the valve stem 44 comes into line or plane contact with the valve seat 46. The valve is thereby closed to stop ejection of the liquid. On other words, upon the tip of the valve stem 44 released from contact with the valve seat 46, the valve is opened to start ejection of the liquid.

In the nozzle of this embodiment, the contact position between the needle-like the valve stem 44 and the valve seat 46, i.e., the position at which the valve is opened and closed, is located near the ejection orifice 42 for the liquid. Thus, the position at which the valve is opened and closed can be made substantially coincident with the position of the ejection orifice. This point will be described in more detail below.

The valve stem 44 has an upper portion in the form of a slender column having a substantially uniform outer diameter d, and has a needle-like lower end portion tapered toward its tip with the outer diameter d decreasing monotonously. The inner wall surface of the nozzle 40 has a uniform tubular shape until near its middle portion, and has a lower portion formed into an inverted-conical shape with the nozzle diameter decreasing monotonously. A part of the nozzle inner wall surface near the ejection orifice functions as the valve seat 46. More concretely, in order that the valve stem 44 and the inner wall surface of the nozzle 40 perform a valve function, the tip of the valve stem 44 and the inner wall surface of the nozzle 40 require to be formed to have different angles relative to the axial direction in a section parallel to the axial direction of the nozzle near the ejection orifice 42. In this embodiment, the angle at which the tip of the valve stem 44 forms relative to the axial direction is set smaller than the angle at which the inner wall surface of the nozzle 40 forms relative to the axial direction. Then, in a condition of the valve being closed, the outer peripheral surface of the valve stem 44 and the inner wall surface of the nozzle 40 come into close contact with each other along a substantially circular line or plane in a plane perpendicular to the nozzle axial direction. Also, by changing the respective angles at which the outer peripheral surface of the valve stem 44 and the inner wall surface of the nozzle 40 form relative to the axial direction, the distance from the ejection orifice 42 to the contact surface between the valve stem 44 and the nozzle 40, i.e., to the position at which the valve is opened and closed, can be adjusted such that the valve opening/closing position is substantially coincident with the position of the ejection orifice 42.

The needle-like valve stem 44 and the nozzle body 40 constituting the nozzle and can be made of any materials so long as they are able to perform a valve function. However, it is desirable to select materials that are satisfactory from the standpoints of sealing ability, machining accuracy, durability and so on. For example, the sealing ability can be improved by using a soft material, such as a resin or brass, to form one of the nozzle 40 and the valve stem 44, and using a hard metallic material to form the other.

FIG. 12 is a schematic view showing an embodiment in which the nozzle 40 having a valve function as described above is attached to the fixed-amount-of-liquid ejecting apparatus. The nozzle 40 according to the present invention is attached to as a part of a valve device 50 of the fixed-amount-of-liquid ejecting apparatus. The valve device 50 has an inlet port 52 to which a liquid is introduced from a liquid reservoir (not shown) through a flow passage, and an outlet port 52 communicating with the nozzle 40. A space defined between the inlet port 52 and the ejection orifice 42 at the nozzle end serves as a liquid receiving portion 56.

In this embodiment, the valve stem 44 constituting the nozzle has a tip positioned near the ejection orifice 42 of the nozzle 40, and has a rear end coupled to a piston 60 of a cylinder 58 described later. The valve stem 44 is thereby vertically movable to advance and retract.

The cylinder 58 itself is well known, and can be constituted as the double-acting type. In the case of employing a double-acting cylinder, ports are connected to an air source 64 through a solenoid selector valve 62. More specifically, in response to a control switching signal S sent to the solenoid selector valve 62 from a control means (not shown), pressurized air supplied from the air source 64 is introduced to one of the ports, whereby movement of the needle-like valve stem 44 is controlled.

In the valve device thus constructed, the liquid is ejected in fixed amount as follows. The signal S is outputted from the control means (not shown) to the solenoid selector valve 62, whereupon the valve 62 is switched over to supply the pressurized air to the lower port so that the needle-like valve stem 44 is moved upward. This causes the valve stem 44 to depart away from the valve seat 46, thus making the ejection orifice 42 open. At the same time, the liquid pressurized to a desired level of pressure is ejected through the ejection orifice 42 for a certain time that is specified in relation to the opening area of the ejection orifice 42. Accordingly, the liquid can be ejected in fixed amount with high precision without a time lag.

On the other hand, the liquid ejection in fixed amount is ended as follows. In response to an ejection end signal S sent to the solenoid selector valve 62 from the control means (not shown), the valve 62 is switched over to supply the pressurized air to the upper port so that the needle-like valve stem 44 is moved downward. The needle-like valve stem 44 is thereby quickly moved downward to come into contact with the valve seat 46, and the ejection orifice 42 is mechanically closed by the needle-like valve stem 44 with certainty.

Ejection of the liquid through the ejection orifice 42 is therefore perfectly stopped upon the needle-like valve stem 44 coming into contact with the valve seat 46. As a result, a risk of liquid leakage during the state in which the nozzle is closed can be securely eliminated.

Thus, the needle-like valve stem and the nozzle body constituting the nozzle are small in size and volume, and are operated to move back (upward) and forth (downward) always smoothly and quickly for mechanically opening and closing the ejection orifice 42 regardless of the magnitude of the liquid pressure. Consequently, not only positive opening and closing of the valve but also a good response can be realized.

To more positively shut off the liquid in the illustrated nozzle at the time when the ejection orifice 42 is closed, it is preferable that the length of a wall portion of the ejection orifice 42, which projects downward from the position where the needle-like valve stem 44 is seated against it, be as small as possible to make substantially zero the amount of the liquid remaining in the ejection orifice 42 after the ejection orifice 42 has been closed.

In the above-described nozzle having the valve function, an air cylinder is employed as means for operating the needle-like valve stem in this embodiment. However, the means for operating the needle-like valve stem is not limited to an air cylinder, but may be realized by any other various driving means such as hydraulic driving means, electric driving means, and magnetic driving means. In addition, the valve can be applied to any types of fixed-amount-of-liquid ejecting apparatus.

Prior to explaining FIGS. 13 to 17, matters common to these drawings will be first described.

When ejecting a liquid in fixed amount with the needle valve as disclosed in the above-cited Japanese Patent Application No. 10-309179 (filing data: Oct. 29, 1998), there accompanies a problem below. A liquid chamber is formed in the needle valve and has an opening in communication with a liquid ejection orifice. An inner space of the liquid chamber which is occupied by a needle valve stem changes with movement of the needle valve stem; namely, a volume in the liquid chamber occupied by the needle valve stem changes. This causes a variation in pressure of the liquid in the liquid chamber. As a result, an ejection rate of the liquid ejected through the ejection orifice (i.e., an amount of the ejected liquid) is minutely changed. The volume occupied by the needle valve stem is at minimum when the valve is opened, but gradually increases as the needle valve stem moves from the open position to the closed position. Then, the volume occupied by the needle valve stem is maximized when the valve is closed, thus affecting the amount of the ejected liquid. Particularly, where the amount of the ejected liquid requires to be constant at a very small value, even small change of the volume occupied by the needle valve stem acts as a substantial element affecting the amount of the ejected liquid.

A primary object of this embodiment of the present invention is therefore to solve the problem experienced in the above-described needle valve, and to provide a fixed-amount-of-liquid ejecting valve which can eject a liquid in small fixed amount in a stable manner with high precision, and which can quickly stop ejection of the liquid. Another object is to provide a fixed-amount-of-liquid ejecting valve which includes pressure compensating means for increasing and decreasing the volume of a liquid chamber so as to cancel a change of liquid pressure in the liquid chamber that occurs with movement of a needle valve stem for opening and closing a liquid ejection orifice.

To achieve the above objects, the fixed-amount-of-liquid ejecting valve according to this embodiment of the present invention comprises a valve body having an inlet port in communication with a liquid reservoir, a liquid chamber formed therein to contain a liquid introduced through the inlet port, and an outlet port through which the liquid in the liquid chamber is ejected; a needle-like valve stem disposed in the liquid chamber movably between a first position and a second position; a valve seat formed to receive a tip of said valve stem to thereby close the outlet port when the valve stem is in the first position; and pressure compensating means for changing the volume of the liquid chamber in synch with movement of the valve stem so that variations of liquid pressure in the liquid chamber caused by movement of the valve stem is canceled.

The needle-like valve stem in the above fixed-amount-of-liquid ejecting valve is moved between the first position and the second position for controlling the amount of the ejected liquid. Changes of the volume occupied by the valve stem in the liquid chamber which occur with the movement of the valve stem, i.e., variations of the liquid pressure in the liquid chamber, are canceled by the pressure compensating means which is operated in synch relation. Therefore, the liquid pressure in the liquid chamber can be held at a predetermined value, and an ejection rate of the liquid during the valve operation can be held constant. In particular, minute variations of the liquid pressure due to movement of a needle valve stem having a small size and volume can be absorbed effectively. As a result, the liquid can be ejected in a stable manner with high precision.

In the fixed-amount-of-liquid ejecting valve according to this embodiment of the present invention, the valve body can be constituted in the form of a cylinder. In that case, the needle valve stem is coupled at its rear end to a piston in the cylinder, and the pressure compensating means is constituted as a pressure compensating piston which is provided independently of the above cylinder piston and disposed such that a part of the pressure compensating piston is located in the liquid chamber. Changes of the volume occupied by the needle valve stem in the liquid chamber, which are caused with movement of the cylinder piston are canceled by moving the pressure compensating piston in a direction opposed to the direction of movement of the cylinder piston.

With such a construction, the pressure compensating piston is moved in synch with back-and-forth movement of the cylinder piston, and the volume in the liquid chamber, which is occupied by one end of the pressure compensating piston located in the liquid chamber, is also changed with movement of the pressure compensating piston. Therefore, pressure variations at the ejection orifice and the vicinity thereof can be easily and quickly dealt with in a precise way. For example, when the valve is opened, the volume occupied by the needle valve stem in the vicinity of the ejection orifice reduces. Conversely, when the valve is closed, the volume occupied by the needle valve stem increases. In the former case, the pressure compensating piston is moved forth to make its one end further enter the liquid chamber to such an extent as preventing a drop of the liquid pressure in the vicinity of the ejection orifice. In the latter case, the pressure compensating piston is moved back to retract its one end to such an extent as preventing a rise of the liquid pressure in the vicinity of the ejection orifice.

In this embodiment, preferably, the valve include means for adjusting a stroke length of the needle valve stem from the first position to the second position. Adjusting the stroke length of the needle valve stem enables the ejection rate of the liquid to be set to a predetermined value.

Further, the movement of the needle valve stem and driving of an actuator, which constitutes the pressure compensating means, can also be performed using respective solenoid driving means. In this case, the needle valve stem is connected at its rear end to first solenoid driving means disposed outside the valve body, and the actuator is connected to second solenoid driving means disposed outside the valve body.

Each of the first and second solenoid driving means can be constituted by a step motor and a mechanism for converting rotation of the step motor into linear motion.

The first solenoid driving means can be constituted by a first plunger connected to the rear end of the valve stem, and a first magnetic coil for driving the first plunger. Also, the second solenoid driving means can be constituted by a second plunger connected to one end of the actuator, and a second magnetic coil for driving the second plunger.

Further, in the ejection valve thus constructed, a pressure sensor may be disposed near a valve seat in the valve chamber to detect a liquid pressure therein, and respective directions and periods of time in which the first and second solenoid driving means are driven may be controlled in accordance with a detected result of the pressure sensor.

Figure 13:
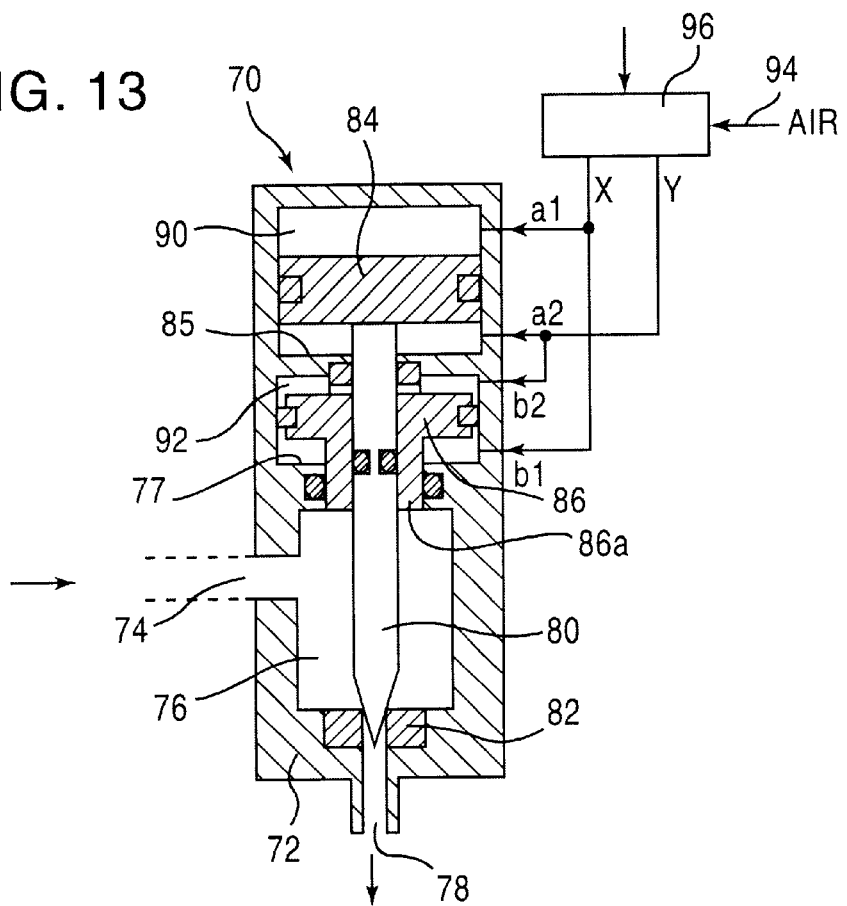
FIG. 13 is a schematic view showing another embodiment of the driving circuit for the needle valve used in the present invention.

FIG. 13 is a schematic view showing another embodiment of the driving circuit for the needle valve used in the present invention.

Referring to FIG. 13, reference numeral 70 denotes the entirety of a needle valve serving as an ejection valve. The needle valve has a valve body constructed in the form of a double-acting air cylinder 72. In the valve body, there is disposed a needle valve stem 80 for ejecting a pressurized liquid in fixed amount through an outlet port 78, the liquid being introduced to a liquid chamber 76 through an inlet port, i.e., a liquid introducing port 74, which is in communication with a liquid reservoir (not shown). The needle valve stem 80 is moved up and down with a piston 84 disposed in the air cylinder 72. The needle valve stem 80 is smoothly movable between a first position at which a needle-like tip of the valve stem 80 contacts an opening formed at the center of a valve seat 82 to thereby stop ejection of the liquid, and a second position which is spaced from the first position upward through a predetermined distance and at which the liquid id ejected through the ejection orifice in maximum amount.

In other words, the needle valve stem 80 is coupled at its rear end to the piston 84, and has the tip arranged to face the opening which is formed at the center of the valve seat 82 and communicates with the ejection orifice 78.

The piston 84 for moving the needle valve stem 80 is slidably disposed in an air chamber 90 defined in the valve body. The needle valve stem 80 is moved downward upon compressed air supplied through a port a1, and is moved upward upon compressed air supplied through a port a2.

Another air chamber 92 is defined separately from the air chamber 90 by a partition 85 and also separately from the liquid chamber 76 by a partition 77. Another piston 86 (referred to as a pressure compensating piston hereinafter) independent of the piston 84 is slidably disposed in the air chamber 92. The pressure compensating piston 86 is constructed such that the needle valve stem 80 fixed to the piston 84 is inserted through a central portion of the piston 86 and the piston 86 does not interfere with smooth movement of the needle valve stem 80. The pressure compensating piston 86 has a projected portion 86a passing through an opening formed in the partition 77 and projecting into the liquid chamber 76. The pressure compensating piston 86 is moved upward upon compressed air supplied through a port b1 provided in the air chamber 92, and is moved downward upon compressed air supplied through a port b2 provided in the air chamber 92.

An amount by which the projected portion 86a of the pressure compensating piston 86 projects into the liquid chamber 76 is adjusted corresponding to movement of the needle valve stem 80 so that changes of the volume occupied by the needle valve stem 80 in the liquid chamber, which are caused with movement of the needle valve stem 80, is canceled by movement of the piston 86. More specifically, when the needle valve stem 80 is moved away from the first position shown in FIG. 13 and advances toward the second position, the volume occupied by the needle valve stem 80 in the liquid chamber 76 reduces and the liquid pressure in the liquid chamber 76 drops. To cancel such a pressure drop, the pressure compensating piston 86 is moved downward to increase the amount by which the projected portion 86a projects into the liquid chamber 76. On the other hand, when the needle valve stem 80 is moved from the second position toward the first position, the volume occupied by the needle valve stem 80 in the liquid chamber 76 increases and the liquid pressure in the liquid chamber 76 rises. To cancel such a pressure rise, the pressure compensating piston 86 is moved upward to reduce the amount by which the projected portion 86a projects into the liquid chamber 76.

The movement of the piston 84 and the movement of the pressure compensating piston 86 in synch with the former movement are carried out by switching over the compressed air supplied from an air compressor 94 by a solenoid selector valve 96 so as to flow through one of flow passages X and Y selectively. The flow passage X is connected to the port a1 of the air chamber 90 in which the piston 84 is disposed, and to the port b1 of the air chamber 92 in which the pressure compensating piston 86 is disposed. The flow passage Y is connected to the port a2 of the air chamber 90 in which the piston 84 is disposed, and to the port b2 of the air chamber 92 in which the pressure compensating piston 86 is disposed.

In the fixed-amount-of-liquid ejecting valve of the present invention thus constructed, the needle valve stem 80 and the pressure compensating piston 86 can be operated in synch relation, and therefore an ejection rate can be always held constant. Particularly, when the needle valve stem 80 is opened from the closed state, it is possible to avoid a phenomenon caused by a pressure drop in the liquid chamber, such as mixing of open air into the liquid or return of the liquid from the ejection orifice to the liquid chamber.

As a result, the liquid can be ejected at a constant ejection rate immediately after the start of operation of the needle valve stem 80, and the liquid ejection can be stopped promptly.

Incidentally, O-rings are employed to seal off a gap between an outer peripheral surface of the piston 84 and an inner wall surface of the air chamber 90, a gap between the needle valve stem 80 and the partition 85, a gap between an outer peripheral surface of the pressure compensating piston 86 and an inner wall surface of the air chamber 92, and a gap between an outer peripheral surface of the projected portion 86a and the partition 77.

Figure 14:
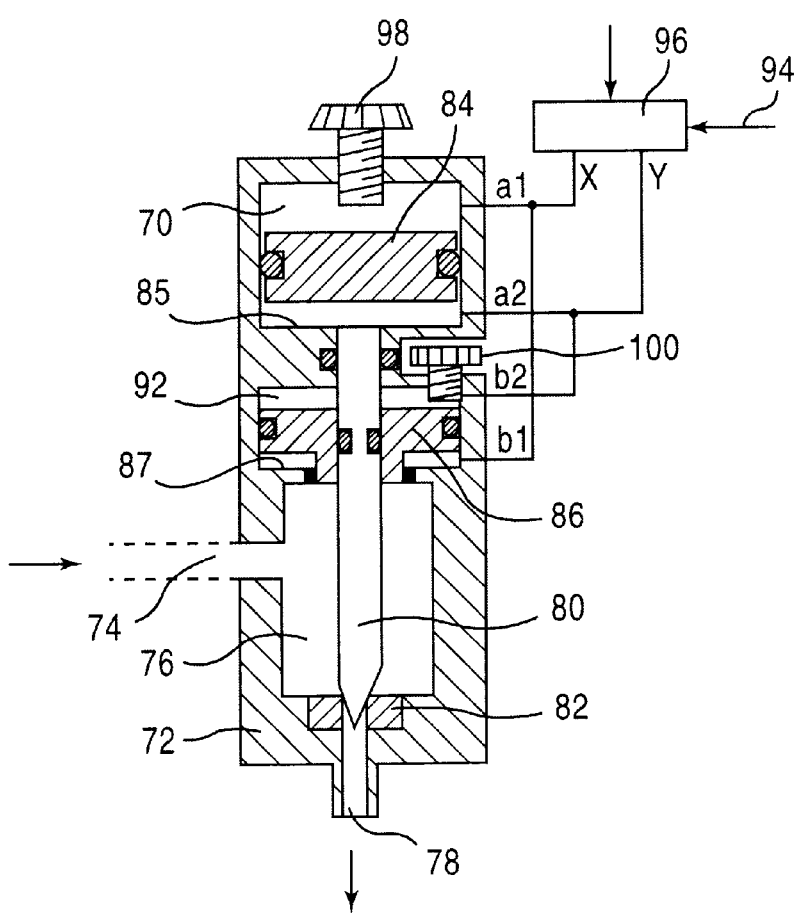
FIG. 14 is a schematic view showing still another embodiment of the driving circuit for the needle valve used in the present invention.

FIG. 14 is a schematic view showing still another embodiment of the driving circuit for the needle valve used in the present invention. This embodiment represent an example in which means for adjusting respective stroke lengths of the piston 84 and the pressure compensating piston 86 are provided. In this embodiment, a male screw 98 screwed into the air chamber 90 from above the needle valve body 70 serves to adjust the displacement of the piston 84, i.e., the stroke length of the needle valve stem. 80 from the first position to the second position. By turning the screw 98 to advance through a predetermined distance, the second position for the needle valve stem 80 can be shifted to a lower level than originally set. Accordingly, the opening of the needle valve can be adjusted to a desired value.

Further, a male screw 100 screwed into the air chamber 92 externally of the partition 85, which divides the air chamber 90 and the air chamber 92 from each other, serves to adjust the displacement of the pressure compensating piston 86. This adjustment of the displacement of the pressure compensating piston 86 is desirably performed corresponding to the adjustment of the displacement of the piston 84. The reason is as follow. For example, when the screw 98 is turned to project its tip into the air chamber 90 for reducing the stroke of the needle valve stem 80 (i.e., for reducing the valve opening), the volume occupied by the needle valve stem 80 in the liquid chamber 76 is increased and decreased over a smaller range. Therefore, the stroke length of the pressure compensating piston 86 requires to be adjusted in match with such a smaller range.

By attaching micrometers to the male screws 98 and 100 as means for adjusting the stroke lengths, the stroke lengths of the respective pistons can be manually in a reliable manner.

While pistons are employed as the pressure compensating means in the above embodiments, the present invention is not limited to such an arrangement. The means for adjusting the stroke length may be any other suitable means, such as a diaphragm or bellows, which can change the volume of the liquid chamber 76 in synch with movement of the needle valve stem 80 so that changes of the volume occupied by the needle valve stem 80 in the liquid chamber 76, which are caused with movement of the needle valve stem 80, are canceled.

Figure 15:
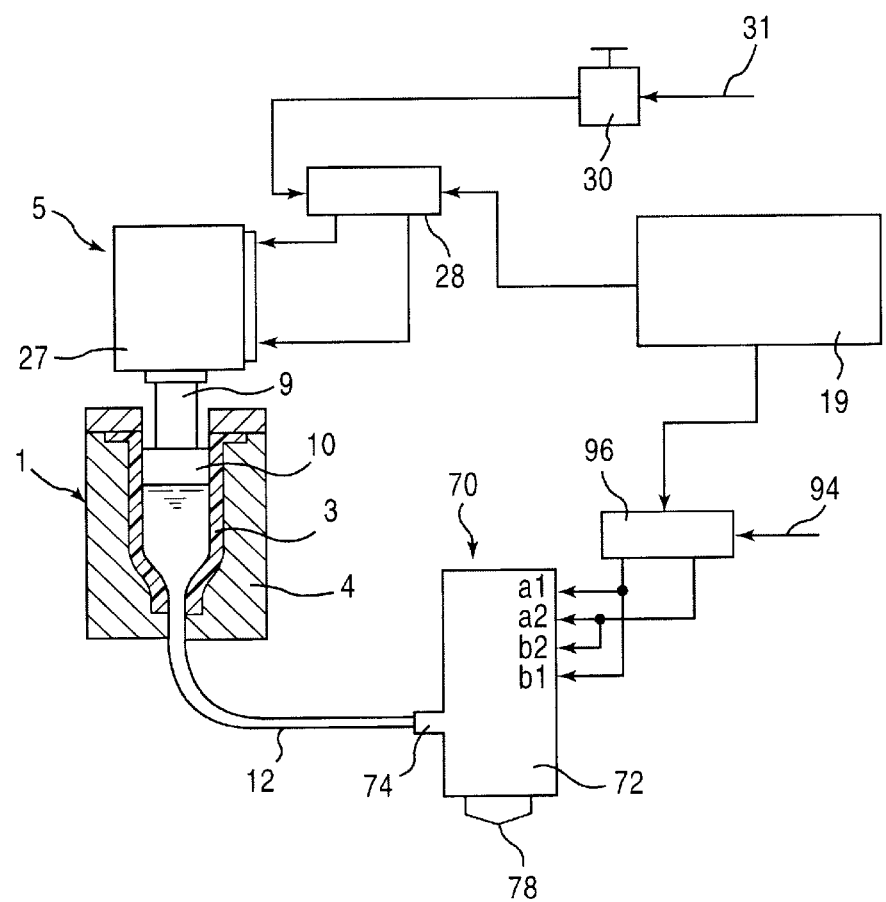
FIG. 15 is a schematic view of a system in which the driving circuit for the needle valve, shown in FIG. 14, is applied to a fixed-amount-of-liquid ejecting system.

FIG. 15 is a schematic view of a system in which the driving circuit for the needle valve, shown in FIG. 14, is applied to the fixed-amount-of-liquid ejecting apparatus shown in FIG. 3. Referring to FIG. 15, reference numeral 1 denotes a liquid reservoir comprising a syringe 3 which can be made of a synthetic resin material, for example, and a holder 4 surrounding the syringe 3 in contact relation from the outer side so as to hold it. The syringe 3 is detachably attached to the holder 4.

A pressurizing means 5 for pressurizing a liquid in the liquid reservoir 1 to a required level of pressure is constructed by an air cylinder 27. A plunger 10 is attached to a fore end of a piston rod 9 of the air cylinder 27. The plunger 10 is preferably allowed to enter the syringe 3 while it is held in liquid tight contact with an inner surface of the syringe 3. The liquid reservoir 1 is connected to a valve body 70 of a needle valve 2 through a liquid flow passage 12. The flow passage 12 is connected to a liquid introducing port 74 formed in the valve body 70. A liquid chamber 76 is in communication with an ejection orifice 78 through an opening formed at the center of a valve seat 82. A needle valve stem 80 is movable back and forth in the valve chamber 76 to open and close the ejection orifice 78, and is operated by an air cylinder 72. The needle valve stem 80 has a tip arranged to face the opening formed at the center of the valve seat 82, and is coupled at its rear end to the piston 84. Further, a liquid pressure compensating piston 86 is disposed independently of the piston 84 between the liquid chamber 76 and the piston 84. The pressure compensating piston 86 functions as follows. When the piston 86 is moved forth with pressurized air supplied to an air chamber 92 on the same side as the piston 84, the volume of the liquid chamber 76 is reduced. On the other hand, when the piston 86 is moved back with pressurized air supplied to an air chamber 77 on the same side as the liquid chamber 76, the volume of the liquid chamber 76 is increased.

Accordingly, the predetermined liquid pressure can be realized by moving the liquid pressure compensating piston 86 forth to some extent when the liquid pressure near the ejection orifice 78 is lower than the predetermined value, and by moving the liquid pressure compensating piston 86 back to some extent when the liquid pressure near the ejection port 78 is higher than the predetermined value.

Further, in this embodiment, the air cylinder 27 for pressurizing the liquid in the liquid reservoir 1 and the double-acting cylinder 72 are connected respectively to solenoid selector valves 28, 96. The solenoid selector valves 28, 96 are connected to a control means 19 for controlling the operations of the valves 28, 96 in accordance with time signals previously inputted to the control means 19. In addition, one solenoid selector valve 28 for controlling supply and discharge of pressurized air to and from the air cylinder 27 is connected to a pressurized air supply source 31 through, e.g., a manual pressure reducing valve 30, whereas the other solenoid selector valve 96 is directly connected to the pressurized air supply source 31.

In the fixed-amount-of-liquid ejecting apparatus thus constructed, the liquid is ejected in fixed amount as follows. The control means 19 outputs signals to the solenoid selector valves 28 and 96. In response to the signal outputted to the solenoid selector valve 28, air pressure is supplied to the air cylinder 27 at a pressure level set by the manual pressure reducing valve 30, thereby moving the plunger 10 downward with a required force. In timed relationship with the above operation, a preset air pressure is supplied to both input ports a2 and b2 of the air cylinder 72, thereby raising the piston 84 to move the needle valve stem 80 upward from the first position to the second position and at the same time lowering the pressure compensating piston 86 so that a reduction of the volume occupied by the needle valve stem 80 in the liquid chamber 76 is canceled. The liquid pressurized to a required level of pressure is then ejected through the ejection orifice 78 for a certain period of time that is specified depending on an opening area of the ejection orifice 78. As a result, the liquid can be ejected in fixed amount with high precision without a time lag.

At the end of the liquid ejection in fixed amount, an ejection end signal is sent to each of the solenoid selector valves 28, 96 from the control means 19, whereupon the supply of the pressurized air to the air cylinder 27 is stopped. In parallel, pressurized air is supplied to both ports a1 and b1 of the air cylinder 72, thereby lowering the piston 84 to move the needle valve stem 80 downward from the second position to the first position and at the same time raising the pressure compensating piston 86 so that an increase of the volume occupied by the needle valve stem 80 in the liquid chamber 76 is canceled. The ejection orifice 78 is thus mechanically closed by the needle valve stem 80 with certainty. An outflow of the liquid through the ejection orifice 78 is therefore perfectly stopped upon closing of the needle valve 70. As a result, a risk of liquid leakage during the state in which the needle valve 70 is closed can be securely eliminated.

Moreover, the needle valve body 80, which constitutes the needle valve 70 and is small in size and volume, is operated to move back and forth always smoothly and quickly for mechanically opening and closing the ejection orifice 78 regardless of the magnitude of the liquid pressure. Consequently, not only positive opening and closing of the needle valve 70 but also a good response can be realized. Additionally, the fixed-amount-of-liquid ejecting apparatus employing the above-describe needle valve can effectively absorb minute pressure variations as follows. A drop of the liquid pressure due to a reduction of the volume occupied by the needle valve stem 80 in the liquid chamber 76, which occurs when the needle valve stem 80 is moved back at the time of starting the ejection of the liquid, can be absorbed by moving the pressure compensating piston 86 forth. Conversely, a rise of the liquid pressure due to an increase of the volume occupied by the needle valve stem 80, which occurs when the needle valve stem 80 is moved forth at the time of stopping the ejection of the liquid, can be absorbed by moving the piston 86 back.

Figure 16:
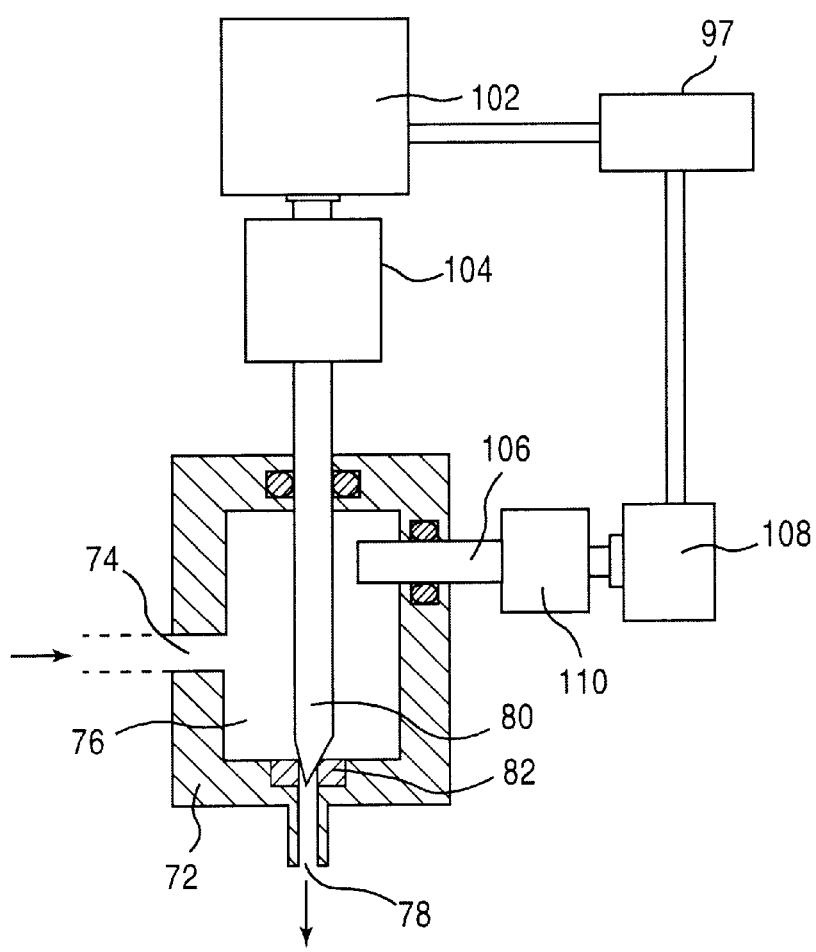
FIG. 16 is a schematic view showing a third embodiment of the driving circuit for the needle valve used in the present invention.

FIG. 16 is a schematic view showing a third embodiment of the driving circuit for the needle valve used in the present invention. In this embodiment, the needle valve stem 80 is moved in the liquid chamber 76 between the first position and the second position with motor driving. The needle valve stem 80 is coupled at its rear end to a mechanism 104 for converting rotation of a motor 102 into linear motion. The pressure compensating means is constituted by an actuator 106 movable with motor driving. The actuator 106 has one end positioned in the liquid chamber 76, and has the other end coupled to a mechanism 110 for converting rotation of a motor 108 into linear motion. Gaps between the valve body 70 and each of the needle valve stem 80 and the actuator 106 are sealed off by O-rings.

The up-and-down (back-and-forth) movement of the needle valve stem 80 and the back-and-forth movement of the actuator 106 with respect to the liquid chamber 76 are performed with motor driving and controlled by a control device 97. When the needle valve stem 80 is moved from the first position to the second position (for ejecting the liquid), the actuator 106 is advanced to enter the liquid chamber 76 so as to cancel a reduction of the volume occupied by the needle valve stem 80 in the liquid chamber 76. Conversely, when the needle valve stem 80 is moved from the second position to the first position (for stopping the liquid ejection), the actuator 106 is retracted from the liquid chamber 76 so as to cancel an increase of the volume occupied by the needle valve stem 80 in the liquid chamber 76. To achieve the above operation, the motors 102 and 108 are driven in synch relation.

Figure 17:
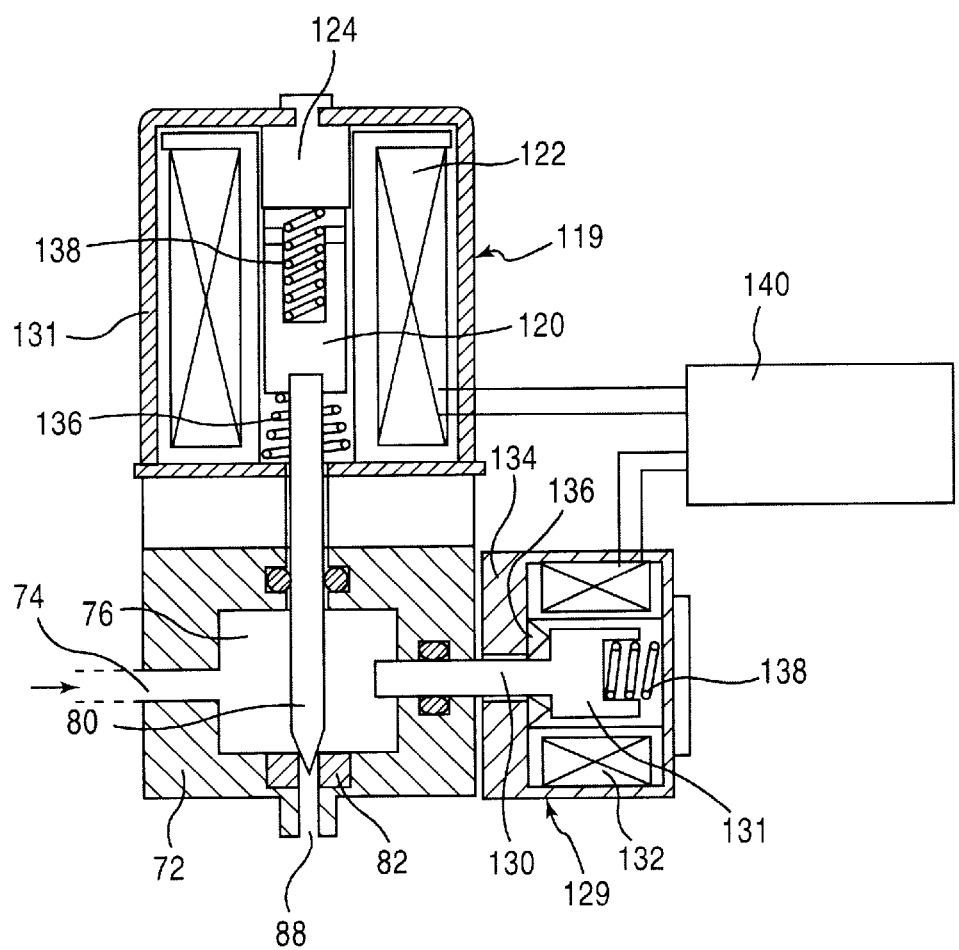
FIG. 17 is a schematic view showing a fourth embodiment of the driving circuit for the needle valve used in the present invention.

FIG. 17 is a schematic view showing a fourth embodiment of the driving circuit for the needle valve used in the present invention. In this embodiment, the needle valve stem 80 is moved in the liquid chamber 76 between the first position and the second position by a solenoid driving device 119. The solenoid driving device 119 comprises a magnetic coil 122 for electromagnetically driving a plunger 120 connected to the rear end of the needle valve stem 80, and a stationary core 124 for stabilizing a magnetic field generated by the magnetic coil 122. The plunger 120 is supported by coil springs 126, 128 at its upper and lower ends, respectively. In the state shown in FIG. 17, the coil spring 126 pushes the plunger 120 upward, and the coil spring 128 pushes the plunger 120 downward. As a whole, the needle valve stem 80 coupled to the plunger 120 closes the ejection orifice 78. Stated otherwise, the plunger 120 is pushed downward by a dominating spring force imposed from the coil spring 128 in a normal state. To move the plunger 120 upward from the shown state to open the ejection orifice 78, a current enough to move the plunger 120 upward against the spring force imposed from the coil spring 128 is supplied to the magnetic coil 122 from the control device 140. When the supply of such a current is stopped, the plunger 120 is pushed downward again by the spring force imposed from the coil spring 128, and therefore the ejection orifice 78 is closed at once.

On the other hand, the pressure compensating means for canceling changes of the volume occupied by the needle valve stem 80 in the liquid chamber 76, which occur when the needle valve stem 80 is moved back and forth, is constituted by an actuator 130 movable back and forth by a solenoid driving device 129. The solenoid driving device 129 comprises a plunger 131 formed integrally with the actuator 130, a magnetic coil 132 for electromagnetically driving the plunger 131, and a stationary core 134 for stabilizing a magnetic field generated by the magnetic coil 132.

The solenoid driving device 129 is operated with a predetermined current supplied to the magnetic coil 132 from the control device 140. The plunger 131 is moved to the left or right under interaction with the magnetic field generated by the magnetic coil 132 upon supply of the current thereto.

The plunger 131 is supported by a leaf spring 136 and a coil spring 138 at its opposite ends, respectively. In the state shown in FIG. 17, the leaf spring 136 pushes the plunger 131 to the right, and the coil spring 138 pushes the plunger 131 to the left. As a whole, the plunger 131 is urged to the right by a dominating spring force imposed from the leaf spring 136, and a tip of the actuator 130 projects into the liquid chamber 76 to some extent.

When the needle valve stem 80 is moved upward in the liquid chamber 76 from the shown state, a predetermined current is supplied to the solenoid driving device 119 from the control device 140 for exciting the magnetic coil 122. In synch with the above operation, a predetermined current is also supplied to the solenoid driving device 129 for exciting the magnetic coil 132. The current supplied to the magnetic coil 122 from the control device 140 is preset to such a value as enabling the needle valve stem 80 to be moved through the distance between the first position and the second position. Likewise, the current supplied to the magnetic coil 132 is preset to such a value as enabling the actuator 130 to be moved through a distance just enough to cancel a reduction of the volume occupied by the needle valve stem 80 in the liquid chamber 76. Therefore, variations of the pressure in the liquid chamber 76, which occur due to the upward movement of the needle valve stem 80, are canceled by advance of the actuator 130 into the liquid chamber 76.

When the supply of those currents is stopped, the needle valve stem 80 is promptly pushed downward by the spring force imposed from the coil spring 128 from the second position to the first position, and at the same time the plunger 131 is promptly moved to the right by the spring force imposed from the leaf spring 136. Also when the needle valve stem 80 is moved downward in such a way, resulting variations of the pressure in the liquid chamber 76 are canceled by the movement of the plunger 131, and the pressure in the liquid chamber 76 is always held constant. As a result, at a transition from the open state to the closed state of the valve, the ejection rate of the liquid, such as a paste, is not increased unlike the prior art, and therefore this embodiment is suitable for applying the liquid so as to draw a line with a uniform width.

Figure 18:
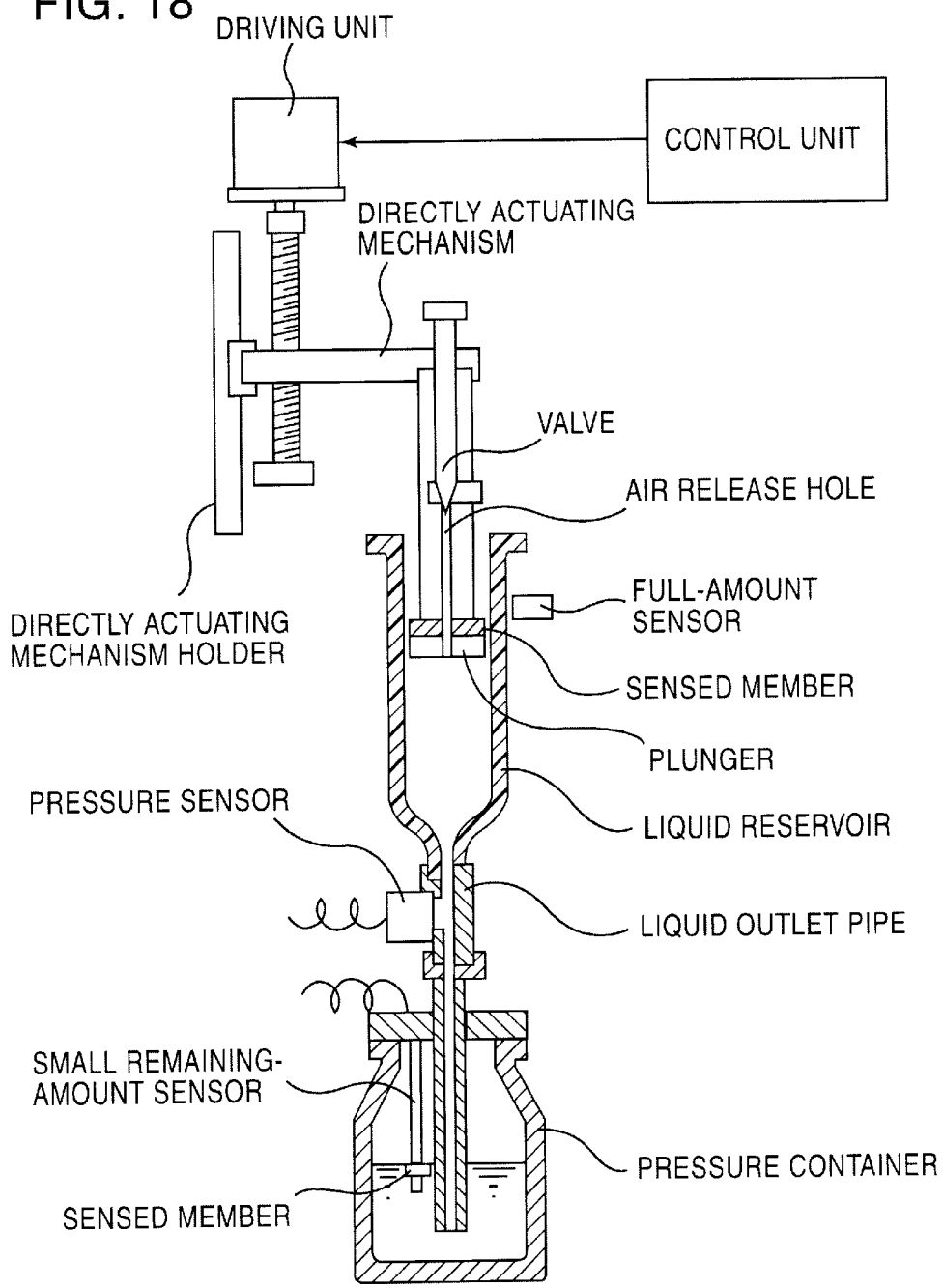
FIG. 18 is a schematic view of an apparatus for filling a liquid into the liquid reservoir used in the present invention.

FIG. 18 is a schematic view of an apparatus for filling a liquid into the liquid reservoir used in the present invention. In an embodiment shown in FIG. 18, a plunger is previously inserted in a liquid reservoir in an airtight fashion, and a directly actuating mechanism is coupled to the plunger. The directly actuating mechanism is coupled to a driving unit, such as a motor, capable of operating in a reversible manner with a control signal. On the other hand, a liquid outlet for a pressure container (possibly a syringe), in which a liquid is stored beforehand, is connected to one end of the liquid reservoir. Sensing means for measuring a pressure, e.g., a pressure sensor, is disposed midway a connecting pipe between the pressure container and the liquid reservoir, and is connected to a control unit which receives a measured result of the sensing means and transmits a signal to the driving unit.

The plunger is pushed forth when a forward rotation signal is sent to the driving unit, and it is retracted when a backward rotation signal is sent to the driving unit. A plunger on the side of the pressure container pushes out the liquid in the pressure container when the pressure container is pressurized by air. When a sensed member attached to the plunger on the side of the pressure container reaches a small remaining-amount level, a small remaining-amount sensor sends a small remaining-amount signal to a control unit. When a sensed member attached to the plunger on the side of the liquid reservoir reaches a full amount level, a full amount sensor sends a full amount signal to the control unit. The pressure sensor disposed in a liquid outlet pipe always transmits a measured pressure data signal to the control unit.

In operation, as shown, the liquid reservoir is connected to the liquid outlet. The plunger is inserted in the liquid reservoir, and is coupled to the directly actuating mechanism. The pressure container containing the liquid filled therein beforehand is connected to the liquid outlet. Air is supplied to the pressure container for pressurization.

The pressure sensor disposed in the liquid outlet pipe measures a pressure and transmits a measured signal to the control unit. The control unit subtracts a preset pressure deducing value from the signal transmitted from the pressure sensor, and sends a retract-operation signal to the driving unit for the directly actuating mechanism to retract the plunger at a preset moving speed so that the pressure data resulting from the subtraction is obtained. When the measured signal of the pressure sensor disposed in the liquid outlet pipe reaches the pressure value after the subtraction, the movement of the plunger is stopped. The above operation is repeated automatically until the liquid full-amount sensor disposed around the liquid reservoir is actuated. When the small remaining-amount sensor on the side of the pressure container is actuated, the filling operation is also stopped.

With the liquid filling apparatus of this embodiment, therefore, entrapment of bubbles can be avoided when a liquid is filled in a liquid reservoir, especially a syringe. In particular, this embodiment is applicable to any work steps for filling a liquid having a medium or higher level of viscosity, and this embodiment is suitable for filling a liquid in any types of liquid reservoirs in which the liquid filled therein is employed by being pushed out of the reservoir end.

INDUSTRIAL APPLICABILITY

The method of the present invention is practically used as follows. For example, when ejecting a liquid in relatively small fixed amount, the pressure in a flow passage after the end of the ejection, particularly the pressure near an ejection orifice, is controlled to be kept at a predetermined specific value, whereby the subsequent ejection of the liquid can be always performed under the constant flow passage condition. Accordingly, by properly setting the force, time, etc. for pressurizing the liquid in the liquid reservoir, the ejection of the liquid in an amount corresponding to the set values can be repeatedly reproduced with high reliability. On the other hand, when ejecting the liquid in relatively large fixed amount, in addition to the above control, the pressure of the supplied liquid is controlled also during the liquid ejection based on the detected result of the liquid pressure in such a manner, for example, that variations of the detected pressure is kept as small as possible. Consequently, the liquid can be ejected in fixed amount as intended. Further, by mechanically opening the ejection orifice of the ejection valve in timed relationship with an increase of the force pressurizing the liquid in the liquid reservoir, the liquid ejection can be started without a time lag. At the end of the ejection, by removing the added increase of the pressurizing force and mechanically closing the ejection orifice of the ejection valve, one cycle of the liquid ejection in fixed amount can be ended with positive shutting-off of the liquid without a risk of liquid leakage.

The apparatus of the present invention is practically used as follows. Since the ejection orifice of the ejection valve is mechanically opened and closed, positive shutting-off of the liquid at the time of stopping the liquid ejection can be more securely achieved without breaking fillers which are sometimes mixed in the liquid, and a leakage of the liquid through the ejection orifice can be prevented sufficiently. In addition, by setting the bore diameter of an air cylinder, which serves as means for pressurizing the liquid, to be sufficiently greater than the inner diameter of the liquid reservoir, the liquid pressure can be raised up to a desired level even when the line air pressure in a general factory is relatively low. As a result, efficiency of the liquid ejecting work can be improved as intended.

By making use of the features described above, the fixed-amount-of-liquid ejecting method and apparatus of the present invention can be applied to apparatuses in which a liquid, including a viscous fluid, a material having consistency, etc., require to be ejected in fixed amount; for example, an apparatus for regularly or irregularly coating an electronic material on a board in the form of points and lines.

What is claimed is:

1. A fixed-amount-of-liquid ejecting method for ejecting a liquid in fixed amount from a liquid reservoir through an ejection valve, said method comprising a step of sensing a first pressure value at a first location in a syringe holding the liquid and a second pressure value at a second location in the ejection valve;

applying a pressure to the liquid beforehand prior to starting ejection of the liquid; and/or holding a pressure near an ejection orifice after the end of liquid ejection at a predetermined specific value using a push member disposed to push a liquid stored in the liquid reservoir so that an ejection rate of the liquid through said ejection orifice is kept constant, wherein the applying and the holding of the pressure is based on the sensing of the first pressure value and the second pressure value.

2. A fixed-amount-of-liquid ejecting method according to claim 1, wherein said step of applying a pressure to the liquid beforehand prior to starting ejection of the liquid and/or holding a pressure near an ejection orifice after the end of liquid ejection at a predetermined specific value comprises a step of detecting a liquid pressure near said ejection orifice and automatically regulating an ejection pressure of the liquid in accordance with a detected result.

3. A fixed-amount-of-liquid ejecting method according to claim 1, wherein said step of applying a pressure to the liquid beforehand prior to starting ejection of the liquid and/or holding a pressure near an ejection orifice after the end of liquid ejection at a predetermined specific value comprises a step of controlling a pressure of the liquid supplied from said liquid reservoir to said ejection valve.

4. A fixed-amount-of-liquid ejecting method according to claim 1, wherein said step of applying a pressure to the liquid beforehand prior to starting ejection of the liquid and/or holding a pressure near an ejection orifice after the end of liquid ejection at a predetermined specific value comprises a step of controlling a pressure of the liquid stored in said liquid reservoir.

5. A fixed-amount-of-liquid ejecting method according to claim 1, wherein said step of applying a pressure to the liquid beforehand prior to starting ejection of the liquid and/or holding a pressure near an ejection orifice after the end of liquid ejection at a predetermined specific value comprises a step of controlling a pressure of the liquid stored in said liquid reservoir by controlling a rate at which the liquid stored in said liquid reservoir reduces.

6. A fixed-amount-of-liquid ejecting method according to claim 1, wherein said step of applying a pressure to the liquid beforehand prior to starting ejection of the liquid and/or holding a pressure near an ejection orifice after the end of liquid ejection at a predetermined specific value comprises a step of controlling a pressure of the liquid stored in said liquid reservoir by controlling constant or variable a rate at which the liquid stored in said liquid reservoir reduces.

7. A fixed-amount-of-liquid ejecting method according to claim 1, wherein temperatures of the liquid in said liquid reservoir and said ejection valve are controlled to be held at desired temperatures.

8. A fixed-amount-of-liquid ejecting method according to claim 1, wherein said ejection value includes a nozzle having in itself a function of a needle value.

9. A fixed-amount-of-liquid ejecting method for ejecting a liquid in fixed amount from a liquid reservoir through an ejection valve, said method comprising a step of applying a pressure to the liquid beforehand prior to starting ejection of the liquid and/or holding a pressure near an ejection orifice after the end of liquid ejection at a predetermined specific value using a push member disposed to push a liquid stored in the liquid reservoir so that an ejection rate of the liquid through said ejection orifice is kept constant; and a liquid filing process wherein, when filling a liquid in said liquid reservoir from a pressure container in which the liquid is stored beforehand, a liquid pressure in said liquid reservoir is controlled to a constant pressure lower than the pressure of air introduced to said pressure container for pressurization, thereby automatically filling the liquid without entrapment of bubbles.

10. A fixed-amount-of-liquid ejecting method for ejecting a liquid in fixed amount from a liquid reservoir through an ejecting valve, said method comprising a step of applying a pressure to the liquid beforehand prior to starting ejection of the liquid and/or holding a pressure near an ejection orifice after the end of liquid ejection at a predetermined specific value using a push member disposed to push a liquid stored in the liquid reservoir so that an ejection rate of the liquid through said ejection orifice is kept constant; and a liquid filling process wherein, when filling a liquid in said liquid reservoir from a pressure container in which the liquid is stored beforehand, a liquid pressure in said liquid reservoir is controlled to a constant pressure lower than the pressure of air introduced to said pressure container for pressurization, and filling of the liquid is automatically stopped upon sensing of a full-amount state of the liquid in said liquid reservoir and/or a small remaining-amount state of the liquid in said pressure container, thereby automatically filling the liquid without entrapment of bubbles.

11. A fixed-amount-of-liquid ejecting method for ejecting a liquid in fixed amount from a liquid reservoir through an ejection valve, said method comprising a step of applying a pressure to the liquid beforehand prior to starting ejection of the liquid and/or holding a pressure near an ejection orifice after the end of liquid ejection at a predetermined specific value using a push member disposed to push a liquid stored in the liquid reservoir so that an ejection rate of the liquid through said ejection orifice is kept constant; and a liquid filling process wherein, when filling a liquid in said liquid reservoir from a pressure container in which the liquid is stored beforehand, a liquid pressure in said liquid reservoir is controlled to a constant pressure lower than the pressure of air introduced to said pressure container for pressurization, and bubbles accidentally generated in said liquid reservoir are removed.

12. A fixed-amount-of-liquid ejecting apparatus comprising a liquid reservoir, means for pressurizing comprising a push member disposed to push a liquid in said liquid reservoir, and an ejection valve communicating with said liquid reservoir, thereby ejecting the liquid in fixed amount from said liquid reservoir through said ejection valve, wherein said apparatus further comprises pressure sensing means for sensing a first pressure value in said liquid reservoir and a second pressure value near said ejection valve, operation control means for controlling operations of said pressurizing means and said ejection valve, and ejection pressure control means for automatically regulating an ejection pressure of the liquid, wherein the pressuring means and ejection pressure control means are controlled based on pressure values received from said pressure sensing means.

13. A fixed-amount-of-liquid ejecting apparatus according to claim 12, wherein said ejection pressure control means comprises an input/output unit, a processing unit and a storage unit, and functions to automatically regulate an ejection pressure of the liquid in accordance with a detected result of a pressure sensor for detecting a liquid pressure near an ejection orifice.

14. A fixed-amount-of-liquid ejecting apparatus according to claim 12, wherein said ejection valve includes means for mechanically opening and closing an ejection orifice of said ejection valve.

15. A fixed-amount-of-liquid ejecting apparatus according to claim 12, wherein said pressurizing means comprises means for pressurizing the liquid stored in said liquid reservoir under a pressure depending on viscosity of the liquid.

16. A fixed-amount-of-liquid ejecting apparatus according to claim 12, wherein said pressurizing means comprises a push member which is associated with an air cylinder for pressing said push member and having a bore diameter sufficiently greater than the inner diameter of said liquid reservoir, and which is disposed to push the liquid stored in said liquid reservoir in a precise and fluid-tight manner.

17. A fixed-amount-of-liquid ejecting apparatus according to claim 12, further comprising liquid temperature control means for controlling a liquid temperature.

18. A fixed-amount-of-liquid ejecting apparatus according to claim 12, wherein said ejection valve including a nozzle provided with a valve mechanism in a nozzle body.

19. A fixed-amount-of-liquid ejecting apparatus comprising
 a liquid reservoir,
 means for pressurizing comprising
  a push member disposed to push a liquid in said liquid reservoir, and
  an ejection valve communicating with said liquid reservoir, thereby ejecting the liquid in fixed amount from said liquid reservoir through said ejection valve, wherein said apparatus further comprises
  operation control means for controlling operations of said pressurizing means and said ejection valve, and
  ejection pressure control means for automatically regulating an ejection pressure of the liquid,
   wherein said operation control means comprises a pressure sensor for detecting a liquid pressure near an ejection orifice, and means for operating said pressurizing means in accordance with a signal from said pressure sensor.

20. A fixed-amount-of-liquid ejecting apparatus comprising:
 a liquid reservoir,
 means for pressurizing comprising
  a push member disposed to push a liquid in said liquid reservoir, and
  an ejection valve communicating with said liquid reservoir, thereby ejecting the liquid in fixed amount from said liquid reservoir through said ejection valve, wherein said apparatus further comprises
  operation control means for controlling operations of said pressurizing means and said ejection valve, and
  ejection pressure control means for automatically regulating an ejection pressure of the liquid,
  wherein said ejection valve comprises
   a valve body having an inlet port in communication with said liquid reservoir,
   a liquid chamber formed therein to contain the liquid introduced through said inlet port, and
   an outlet port through which the liquid in said liquid chamber is ejected,
   a needle-like valve stem disposed in said liquid chamber movably between a first position and a second position,
   a valve seat formed to receive a tip of said valve stem to thereby close said outlet port when said valve stem is in the first position, and
   pressure compensating means for changing the volume of said liquid chamber in synch with movement of said valve stem so that variations of liquid pressure in said liquid chamber caused by movement of said valve stem is canceled.

21. A fixed-amount-of-liquid ejecting apparatus comprising:
 a liquid reservoir,
 means for pressurizing comprising
  a push member disposed to push a liquid in said liquid reservoir, and
  an ejection valve communicating with said liquid reservoir, thereby ejecting the liquid in fixed amount from said liquid reservoir through said ejection valve, wherein said apparatus further comprises
  operation control means for controlling operations of said pressurizing means and said ejection valve,
  ejection pressure control means for automatically regulating an ejection pressure of the liquid, and
 a filling apparatus which comprises
  a liquid reservoir including a plunger inserted therein in an airtight manner,
  a pressure container in which the liquid is stored beforehand, and
  a plunger direct-actuating control mechanism for maintaining a liquid pressure in said liquid reservoir at a constant pressure lower than the pressure of air introduced to said pressure container for pressurization, thereby automatically filling the liquid in said liquid reservoir without entrapment of bubbles.

22. A fixed-amount-of-liquid ejecting apparatus comprising:
 a liquid reservoir,
 means for pressurizing comprising
  a push member disposed to push a liquid in said liquid reservoir, and
  an ejection valve communicating with said liquid reservoir, thereby ejecting the liquid in fixed amount from said liquid reservoir through said ejection valve, wherein said apparatus further comprises
  operation control means for controlling operations of said pressurizing means and said ejection valve,
  ejection pressure control means for automatically regulating an ejection pressure of the liquid, and
 a filling apparatus which comprises
  a liquid reservoir including a plunger inserted therein in an airtight manner,
  a pressure container in which the liquid is stored beforehand,
  a plunger direct-actuating control mechanism for maintaining a liquid pressure in said liquid reservoir at a constant pressure lower than the pressure of air introduced to said pressure container for pressurization, and
  means for sensing a full-amount state of the liquid in said liquid reservoir and/or means for sensing a small remaining-amount state of the liquid in said pressure container, and for automatically stopping filling of the liquid in accordance with a sensed signal, thereby automatically filling the liquid in said liquid reservoir without entrapment of bubbles.

23. A fixed-amount-of-liquid ejecting apparatus comprising:

a liquid reservoir, means for pressurizing comprising
- a push member disposed to push a liquid in said liquid reservoir, and
- an ejection valve communicating with said liquid reservoir, thereby ejecting the liquid in fixed amount from said liquid reservoir through said ejection valve, wherein said apparatus further comprises operation control means for controlling operations of said pressurizing means and said ejection valve, ejection pressure control means for automatically regulating an ejection pressure of the liquid, and a filling apparatus which comprises
- a liquid reservoir including a plunger inserted therein in an airtight manner,
- a pressure container in which the liquid is stored beforehand,
- a plunger direct-actuating control mechanism for maintaining a liquid pressure in said liquid reservoir at a constant pressure lower than the pressure of air introduced to said pressure container for pressurization, and
- means for removing bubbles accidentally generated in said liquid reservoir, said bubble removing means including a valve structure which has an air release hole for communicating said plunger inserted in said liquid reservoir with the outside and is able to close the air release hole at any time, thereby automatically filling the liquid in said liquid reservoir without entrapment of bubbles.

* * * * *